(12) United States Patent
Ueno et al.

(10) Patent No.: US 8,148,716 B2
(45) Date of Patent: Apr. 3, 2012

(54) GROUP III NITRIDE SEMICONDUCTOR OPTICAL DEVICE, EPITAXIAL SUBSTRATE, AND METHOD OF MAKING GROUP III NITRIDE SEMICONDUCTOR LIGHT-EMITTING DEVICE

(75) Inventors: Masaki Ueno, Itami (JP); Yohei Enya, Itami (JP); Takashi Kyono, Itami (JP); Yusuke Yoshizumi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 129 days.

(21) Appl. No.: 12/837,904

(22) Filed: Jul. 16, 2010

(65) Prior Publication Data

US 2011/0073888 A1 Mar. 31, 2011

(30) Foreign Application Priority Data

Sep. 30, 2009 (JP) ................................. 2009-228887

(51) Int. Cl.
*H01L 33/02* (2010.01)
(52) U.S. Cl. ............ 257/14; 257/96; 257/101; 257/103; 257/E33.003; 438/47
(58) Field of Classification Search .................... 257/14, 257/96, 101, 103, E33.003; 438/47
See application file for complete search history.

(56) References Cited

U.S. PATENT DOCUMENTS

| 8,048,702 B2* | 11/2011 | Enya et al. ...................... 438/47 |
| 8,053,806 B2* | 11/2011 | Kyono et al. ................. 257/102 |
| 2010/0055820 A1* | 3/2010 | Akita et al. ..................... 438/47 |
| 2010/0190284 A1* | 7/2010 | Enya et al. ...................... 438/47 |

FOREIGN PATENT DOCUMENTS

JP 2009-071127 A 4/2009

OTHER PUBLICATIONS

Partial translation of JP2009071127 (A), 13 pages, Feb. 4, 2009.*

(Continued)

*Primary Examiner* — George Fourson, III
(74) *Attorney, Agent, or Firm* — Venable LLP; Michael A. Sartori

(57) ABSTRACT

A group III nitride semiconductor optical device includes: a substrate comprising a group III nitride semiconductor; a first group-III nitride semiconductor region on a primary surface of the substrate; a second group-III nitride semiconductor region on the primary surface of the substrate; and an active layer between the first group-III nitride semiconductor region and the second group-III nitride semiconductor region. The primary surface of the substrate tilts at a tilt angle in the range of 63 degrees to smaller than 80 degrees toward the m-axis of the group III nitride semiconductor from a plane perpendicular to a reference axis extending along the c-axis of the group III nitride semiconductor. The first group-III nitride semiconductor region, the active layer, and the second group-III nitride semiconductor region are arranged in the direction of the normal axis to the primary surface of the substrate. The active layer is configured to produce light having a wavelength in the range of 580 nm to 800 nm. The active layer includes an epitaxial semiconductor layer comprising a gallium nitride based semiconductor containing indium as a group III element. The epitaxial semiconductor layer has an indium content ranging from 0.35 to 0.65. The c-axis of the gallium nitride based semiconductor tilts from the normal axis. The reference axis is oriented in the direction of either the axis [0001] or [000-1] of the group III nitride semiconductor.

20 Claims, 10 Drawing Sheets

OTHER PUBLICATIONS

Funato et. al., "Blue, Green, and Amber IngaN/GaN Light-Emitting Diodes on Semipolar {1122} GaN Bulk Substrates," Japanese Journal of Applied Physics, vol. 45, No. 26, pp. L659-L662, 2006.

Okamoto et. al., "Nonpolar m-plane InGaN multiple quantum well laser diodes with a lasing wavelength of 499.8 nm," Applied Physics Letters, vol. 94, pp. 071105-1 to 071105-3, 2009.

* cited by examiner

GROUP III NITRIDE SEMICONDUCTOR OPTICAL DEVICE, EPITAXIAL SUBSTRATE, AND METHOD OF MAKING GROUP III NITRIDE SEMICONDUCTOR LIGHT-EMITTING DEVICE

BACKGROUND OF THE INVENTION

1. Field of the Invention

The present invention relates to a group III nitride semiconductor optical device, an epitaxial substrate, and a method of making a group III nitride semiconductor light-emitting device.

2. Related Background Art

Nonpatent Literature 1 discloses a light-emitting diode made of a gallium nitride based semiconductor. This light-emitting diode is fabricated on a (11-22) plane of GaN. The light-emitting diode has an emission wavelength of about 420 nm, about 520 nm, or about 620 nm in the range of blue to amber.

Nonpatent Literature 2 discloses a laser diode made of a gallium nitride based semiconductor. This laser diode is fabricated on the m-plane of GaN. The laser diode has an emission wavelength of 499.8 nm.

Patent Literature 1 discloses a laser diode fabricated on a {11-22} plane of a GaN substrate. This laser diode has an emission wavelength ranging from 480 nm to 650 nm.
Patent Literature 1: Japanese Unexamined Patent Application Publication No. 2009-71127
Nonpatent Literature 1: Japanese Journal of Applied Physics, Vol. 45, No. 26, 2006, pp. L659-L662
Nonpatent Literature 2: APPLIED PHYSICS LETTERS 94, 2009, 071105

SUMMARY OF THE INVENTION

According to the inventors' investigation, when a gallium nitride based semiconductor containing indium as a group III element (e.g. InGaN) is grown on the m-plane or {11-22} plane of GaN, such a plane orientation exhibits an excellent indium incorporation, but the indium distribution in the InGaN layer grown thereon significantly varies. Consequently, the emission spectrum has a large full width at half maximum. Laser diodes of gallium nitride based semiconductor emit not only blue light but also green light. For widening the emission wavelength region toward a longer wavelength, it is required to grow a well layer having a uniform indium distribution over a wide range of indium content. Emission of a longer wavelength would be more sensitive to variation in the indium content.

It is an object of the present invention, accomplished under the above background, to provide a group III nitride semiconductor optical device including a well layer having a relatively high indium content and a small indium distribution. It is another object of the invention to provide an epitaxial substrate for the group III nitride semiconductor optical device. It is a still another object of the invention to provide a method of making the group III nitride semiconductor light-emitting device.

A group III nitride semiconductor optical device in an aspect of the present invention comprises: (a) a substrate comprising a group III nitride semiconductor; (b) a first group-III nitride semiconductor region provided on a primary surface of the substrate; (c) a second group-III nitride semiconductor region provided on the primary surface of the substrate; and (d) an active layer provided between the first group-III nitride semiconductor region and the second group-III nitride semiconductor region, the primary surface of the substrate tilting with respect to a plane perpendicular to a reference axis at a tilt angle in a range of not less than 63 degrees and less than 80 degrees, the reference axis extending along the c-axis of the group III nitride semiconductor toward an m-axis of the group III nitride semiconductor; the first group-III nitride semiconductor region including a first conductive type semiconductor layer; the second group-III nitride semiconductor region including a second conductive type semiconductor layer; the first group-III nitride semiconductor region, the active layer, and the second group-III nitride semiconductor region being arranged in a direction of an axis normal to the primary surface of the substrate; the active layer being provided to generate light having a wavelength in a range of 580 nm to 800 nm; the active layer including an epitaxial semiconductor layer; the epitaxial semiconductor layer comprising a gallium nitride based semiconductor, the gallium nitride based semiconductor containing indium as a group III element; the epitaxial semiconductor layer having an indium content ranging from 0.35 to 0.65; the c-axis of the gallium nitride based semiconductor tilting with respect to the normal axis; and the reference axis being oriented in a direction of one of [0001] axis and [000-1] axis of the group III nitride semiconductor.

In this group III nitride semiconductor optical device, the active layer includes the epitaxial semiconductor layer containing indium as a group III element, and generates light having a wavelength in the range of 580 nm to 800 nm. The active layer is provided on the primary surface of a substrate comprising a group III nitride semiconductor, and the primary surface of the substrate tilts at a tilt angle in the range of not less than 63 degrees and less than 80 degrees toward the m-axis of the group III nitride semiconductor with respect to a plane perpendicular to the reference axis that extends along the c-axis of the group III nitride semiconductor. As a result, although the epitaxial semiconductor layer has an indium content ranging from 0.35 to 0.65, the indium distribution of the epitaxial semiconductor layer does not significantly vary.

Another aspect of the present invention is an epitaxial substrate for a group III nitride semiconductor optical device. The epitaxial substrate comprises (a) a substrate comprising group III nitride semiconductor; (b) a first group-III nitride semiconductor region provided on a primary surface of the substrate; (c) a second group-III nitride semiconductor region provided on the primary surface of the substrate; and (d) an active layer provided between the first group-III nitride semiconductor region and the second group-III nitride semiconductor region, the primary surface of the substrate tilting with respect to a plane perpendicular to a reference axis at a tilt angle in a range of not less than 63 degrees and less than 80 degrees, the reference axis extending along the c-axis of the group III nitride semiconductor toward the m-axis of the group III nitride semiconductor; the first group-III nitride semiconductor region including a first conductive type semiconductor layer; the second group-III nitride semiconductor region including a second conductive type semiconductor layer; the first group-III nitride semiconductor region, the active layer, and the second group-III nitride semiconductor region being arranged in a direction of an axis normal to the primary surface of the substrate; the active layer being provided to generate light having a wavelength in a range of 580 nm to 800 nm; the active layer including an epitaxial semiconductor layer, the epitaxial semiconductor layer comprising a gallium nitride based semiconductor, the gallium nitride based semiconductor containing indium as a group III element; the epitaxial semiconductor layer having an indium content ranging from 0.35 to 0.65; the c-axis of the gallium nitride semiconductor tilting with respect to the normal axis; and the reference axis being oriented in a direction of one of [0001] axis and [000-1] axis of the group III nitride semiconductor.

In this epitaxial substrate, the active layer includes an epitaxial semiconductor layer containing indium as a group III nitride element, and generates light having a wavelength in the range of 580 nm to 800 nm. The active layer is provided on the primary surface of a substrate that tilts at a tilt angle in the range of not less than 63 degrees and less than 80 degrees toward the m-axis of the group III nitride semiconductor with respect to a plane perpendicular to a reference axis extending along the c-axis of the group III nitride semiconductor. As a result, although the epitaxial semiconductor layer has an indium content ranging from 0.35 to 0.65, the indium distribution of the epitaxial semiconductor layer does not widely vary.

A further aspect of the present invention is directed to a method of making a group III nitride semiconductor light-emitting device. This method comprises the steps of: (a) preparing a substrate, the substrate comprising a group III nitride semiconductor; (b) growing a first group-III nitride semiconductor region on a primary surface of the substrate; (c) growing an active layer on the primary surface of the substrate, the active layer generating light of a wavelength in a range of 580 nm to 800 nm; and (d) growing a second group-III nitride semiconductor region on the primary surface of the substrate, the active layer being provided between the first group-III nitride semiconductor region and the second group-III nitride semiconductor region, the primary surface of the substrate tilting at a tilt angle in a range of not less than 63 degrees and less than 80 degrees toward the m-axis of the group III nitride semiconductor with respect to a plane perpendicular to a reference axis, the reference axis extending along the c-axis of the group III nitride semiconductor, the first group-III nitride semiconductor region including a first conductive type semiconductor layer, the second group-III nitride semiconductor region including a second conductive type semiconductor layer, the active layer including an epitaxial semiconductor layer, the epitaxial semiconductor layer comprising a gallium nitride based semiconductor, the gallium nitride based semiconductor containing indium as a group III element, the epitaxial semiconductor layer having an indium content ranging from 0.35 to 0.65, a c-axis of the group III nitride semiconductor tilting with respect to the normal axis, and a direction of the reference axis is the same as a direction of one of axis [0001] and [000-1] of the group III nitride semiconductor.

In this method, the active layer has an epitaxial semiconductor layer, and generates light having a wavelength in the range of 580 nm to 800 nm. Further, the active layer is grown on the primary surface comprising a group III nitride semiconductor. The primary surface of the substrate tilts at a tilt angle in the range of not less than 63 degrees and less than 80 degrees toward the m-axis of the group III nitride semiconductor with respect to a plane perpendicular to the reference axis that extends along the c-axis of the group III nitride semiconductor. As a result, although the epitaxial semiconductor layer has an indium content ranging from 0.35 to 0.65, the indium distribution of the epitaxial semiconductor layer does not significantly vary.

In the aspect of the invention described above, preferably the primary surface of the substrate tilts from the surface perpendicular to the reference axis toward the m-axis of the group III nitride semiconductor at a tilt angle of not smaller than 70 degrees. In this aspect, the primary surface of the substrate having a tilt angle of 70 degrees or more can further reduce the variation in the indium distribution.

In the aspects of the invention described above, more preferably the primary surface of the substrate tilts at a tilt angle in the range of not less than 71 degrees to not more than 79 degrees toward the m-axis of the group III nitride semiconductor with respect to the surface perpendicular to the reference axis. In the aspects, step edge growth is predominant in the range of the tilt angle, thereby reducing segregation of indium.

In the aspects of the invention described above, preferably the off angle defined in the direction of the a-axis of the group III nitride semiconductor has a non-zero value, and is in the range of −3 degrees to +3 degrees. In the method, the off angle in the direction of the a-axis in the range of −3 degrees to +3 degrees provides satisfactory surface morphology.

In the aspects of the invention described above, the primary surface of the substrate may be composed by a semiconductor surface that tilts at an angle ranging from −3 degrees to +3 degrees with respect to either {20-21} plane or {20-2-1} plane of the group III nitride semiconductor. In this method, the surface orientation and the range of tilt angle allows the incorporation of indium and the segregation of indium to become well balanced, thereby forming the well layer that has an excellent crystalline quality.

In the aspects of the invention described above, preferably the active layer has a single quantum well structure. In this method, the well layer that generates an emission in the range of the wavelength from red to infrared has an indium content that is equal to or more than 0.3. The well layer constituted by an InGaN layer is highly strained, so that this may produce defects in the InGaN layer. The active layer having a single quantum well structure does not include any arrangement of well layers highly strained, and thus provides excellent crystallinity. In addition, in a multiple quantum well structure, deep quantum well of the well layers generating light of long-wavelength makes a carrier distribution among the quantum wells nonuniform. Thus, a single quantum well structure is preferred.

In the aspects of the invention described above, the active layer may be configured to produce light having a wavelength in the range of longer than 650 nm to 800 nm. The active layer generating light of a wavelength in the range of not shorter than 650 nm and not longer than 800 nm includes a well layer having a large indium content, and the present invention provides the well layer with a uniform indium distribution.

In the aspects of the invention described above, a first optical guide layer may further be provided between the active layer and the first group-III nitride semiconductor region, and a second optical guide layer may further be provided between the active layer and the second group-III nitride semiconductor region. Preferably, the total thickness of the first and second optical guide layers is not smaller than 0.7 μm.

In this method, the group III nitride semiconductor optical device may include a laser diode. In this laser diode, the first and second optical guide layers having a total thickness of not smaller than 0.7 μm enable suitable optical confinement in the region that includes the first and second optical guide layers and the active layer having a well layer with a high indium content and a low indium distribution.

In the aspects of the invention described above, preferably the first optical guide layer includes a first group-III nitride semiconductor layer containing indium as a group III element, and the second optical guide layer includes a second group-III nitride semiconductor layer containing indium as a group III element, each of the first and second group-III nitride semiconductor layers has an indium content of higher than 0.02.

In the present method, the first and second group-III nitride semiconductor layers having an indium content of higher than 0.02 can reduce a difference in the indium content between the optical guide layers and the well layer. Although the lattice constant of the well layer is greatly different from the lattice constant of the cladding layer, the graded change of these optical guide layers can reduce the effect of the large difference in the lattice constant therebetween. Since these optical guide layers include a group III nitride semiconductor layer containing indium as a group III element, a difference in the refractive index between the active layer and the cladding layer can be made suitable.

In the aspects of the invention described above, preferably the total thickness of the first and second optical guide layers is not smaller than 0.9 μm.

In the aspects, since the total thickness of the first and second optical guide layers is not smaller than 0.9 μm, optical confinement into the optical guide layer and the active layer is readily achieved.

In the aspects of the invention described above, the first optical guide layer may include a first optical guide portion and a second optical guide portion, and the second optical guide portion has a larger refractive index than that of the first optical guide layer. The first optical guide layer may be provided between the second optical guide layer and the first group-III nitride semiconductor region, and the second optical guide layer may be provided between the first optical guide layer and the active layer. This can readily achieve optical confinement by use of a gradual change in the refractive index.

In the aspects of the invention described above, preferably the second optical guide portion includes an InGaN layer, and the first optical guide layer includes at least one of an InGaN layer, an InAlGaN layer, an InAlN layer, and a GaN layer.

In the aspects, a region from the cladding layer to the active layer can be provided with a preferred refractive-index profile.

In the aspects of the invention described above, the second optical guide portion includes an InAlN layer, and the first optical guide includes at least one of an InGaN layer, an InAlGaN layer, an InAlN layer, and a GaN layer.

In the aspects, a region from the cladding layer to the active layer can be provided with a preferred refractive-index profile.

In the aspects of the invention described above, the first optical guide layer may include a first InGaN layer having an indium content of not lower than 0.07. The aspects can achieve suitable optical confinement in the active layer and the optical guide layer. In the aspects of the invention described above, the second optical guide layer may include a second InGaN layer having an indium content of not lower than 0.07. This aspect can achieve suitable optical confinement in the active layer and the optical guide layer.

In the aspects of the invention described above, preferably the first optical guide layer includes a first InAlN layer having a larger refractive index than that of GaN.

In this aspects, since InAlN contains both indium having an atomic radius larger than that of gallium and aluminum having an atomic radius smaller than that of gallium atoms, its lattice constant and its band gap can be changed independently of each other by adjusting the indium content and the aluminum content. As a result, InAlN can be used as an optical guide layer.

In the aspects of the invention described above, preferably the first InAlN layer has a lattice constant that is matched to that of GaN.

In the present invention, since InAlN has a band gap bowing, InAlN having a composition lattice-matched to GaN exhibits a higher refractive index than that of GaN. As a result, InAlN is suitable for adjusting the refractive index and the lattice constant of the optical guide layer.

In the aspects of the invention described above, preferably the second optical guide layer includes a second InAlN layer having a larger refractive index than that of GaN.

In the aspects, since the refractive index of the second InAlN layer is larger than that of GaN, adjustment of the lattice constant can provide the optical guide layer suitable for the active layer that has a large indium content.

In the aspects of the invention described above, the substrate may comprise GaN, the first optical guide layer may include an $In_{X1}Al_{Y1}Ga_{1-X1-Y1}N$ ($0 \leqq X1 \leqq 1$, $0 \leqq Y1 \leqq 1$) layer and a GaN layer, and the second optical guide layer may include an $In_{X2}Al_{Y2}Ga_{1-X2-Y2}N$ ($0 \leqq X2 \leqq 1$, $0 \leqq Y2 \leqq 1$) layer and a GaN layer.

In the aspects, when the optical guide layer includes at least two semiconductor layers, this optical guide layer may include one of the following combinations of the semiconductor layers: InGaN/InGaN, InGaN/InAlGaN, InAlN/GaN, InAlN/InAlGaN, InGaN/InAlN, and InAlN/InGaN.

In the aspects of the invention described above, the second conductive type may indicate a p-type, and the first conductive type may indicate an n-type. The group III nitride semiconductor optical device may further include an electron blocking layer provided between the active layer and the second group-III nitride semiconductor region. Preferably, the electron blocking layer comprises the same material as that of the substrate.

In the aspects, the electron blocking layer comprising the same material as that of the substrate allows the reduction in strain therein. For example, the substrate and the electron blocking layer may comprise GaN.

The foregoing object and other objects, features, and advantages of the present invention can more readily become apparent in view of the following detailed description of the preferred embodiments of the present invention proceeding with reference to the accompanying drawings.

DETAILED DESCRIPTION OF PREFERRED EMBODIMENTS

The expertise of the present invention can be readily understood in view of the following detailed description with reference to the accompanying drawings presented by way of illustration.

Embodiments of a group III nitride semiconductor optical device, a group III nitride semiconductor light-emitting device, a method of making a group III nitride semiconductor light-emitting device, a method of making a group III nitride semiconductor optical device, and methods of forming an epitaxial wafer and a group III nitride semiconductor region are described with reference to the accompanying drawings. The same portions will be denoted by the same reference signs, if possible.

In the description, in crystal axes of the hexagonal crystal structure such as a1-axis, a2-axis, a3-axis and c-axis, a minus sign "−1" prefixed to a numeral in the representation of crystal orientation indicates a direction opposite thereto. For example, the direction of axis [000−1] is opposite to the direction of axis [0001].

Figure 1:
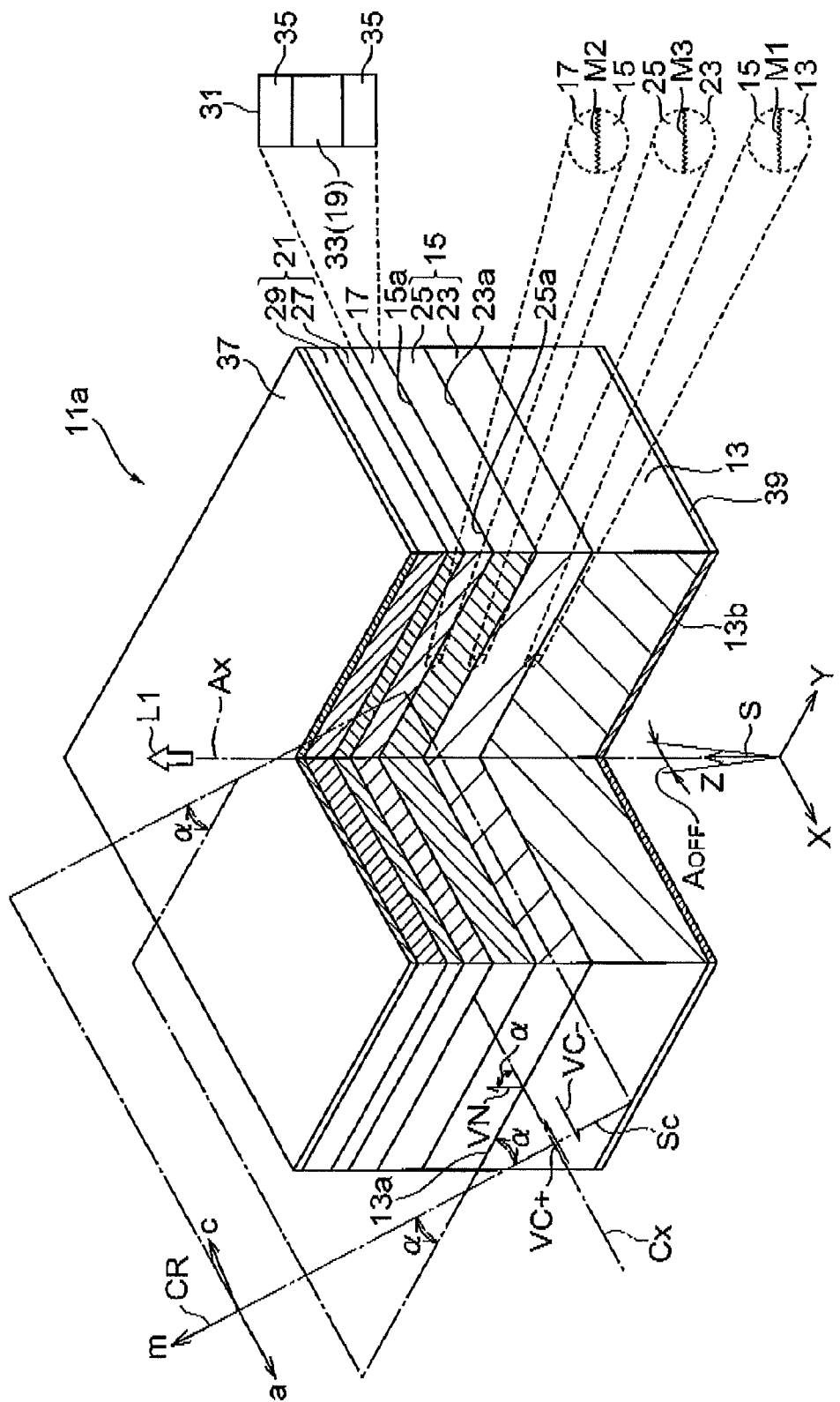
FIG. 1 is a schematic view illustrating the structure of a group III nitride semiconductor optical device in accordance with an embodiment of the present invention.

FIG. 1 is a schematic view illustrating the structure of a group III nitride semiconductor optical device in accordance with an embodiment of the present invention. As a typical example, the group III nitride semiconductor device 11a encompasses a light-emitting diode.

The group III nitride semiconductor optical device 11a includes a substrate 13, a group III nitride semiconductor epitaxial region 15, and an active layer 17. The substrate 13 comprises a first group-III nitride semiconductor such as GaN, InGaN, or AlGaN. GaN is a binary compound semiconductor, and thus exhibits excellent crystallinity and provides a stable primary surface of the substrate. The first group-III nitride semiconductor may comprise AlN, for example. The c-plane of the substrate 13 extends along a plane Sc shown in FIG. 1. Coordinate system CR is depicted on the plane Sc in order to show the crystal axes (c-axis, a-axis, and m-axis) for the group III nitride semiconductor having a hexagonal crystal system. The primary surface 13a of the substrate 13 is inclined at an inclination angle in the range of 63 degrees to smaller than 80 degrees toward the direction of the m-axis of the first group-III nitride semiconductor with respect to a surface perpendicular to a reference axis Cx extending along the c-axis of the first group-III nitride semiconductor. The inclination angle α is defined by an angle between the reference axis Cx and the normal vector VN normal to the primary surface 13a of the substrate 13. In the embodiment, the angle α is equal to the angle that the vector VC+ and the vector VN form. The group III nitride semiconductor epitaxial region 15 is provided on the primary surface 13a. The group III nitride semiconductor epitaxial region 15 may include one or more semiconductor layers. An active layer 17 is provided on the group III nitride semiconductor epitaxial region 15. The active layer 17 is configured to produce light having a wavelength in the range of 580 nm to 800 nm. The active layer 17 includes at least one epitaxial semiconductor layer 19 disposed on the group III nitride semiconductor epitaxial region 15. The epitaxial semiconductor layer 19 comprises a second group-III nitride semiconductor containing indium as a group III element. The second group-III nitride semiconductor comprises, for example, InGaN or InAlGaN. The epitaxial semiconductor layer 19 has an indium content ranging from 0.35 to 0.65. The c-axis of the gallium nitride semiconductor tilts from the normal axis. The thickness direction in the epitaxial semiconductor layer 19 is inclined with respect to the reference axis Cx. The reference axis Cx may extend in the direction of the [0001] or [000−1] axis of the first group-III nitride semiconductor. In the embodiment, the reference axis Cx is oriented to the direction of the vector VC+. As a result, the vector VC− is oriented to the direction of the axis [000−1].

In the group III nitride semiconductor optical device 11a, an active layer 17 has an epitaxial semiconductor layer 19 containing indium as a group III element, and generates light of a wavelength in the range of 580 nm to 800 nm. The active layer 17 is disposed on a primary surface 13a of a substrate of the group III nitride semiconductor. The primary surface 13a of the substrate is inclined toward the direction of the m-axis of the group III nitride semiconductor at an angle in the range of 63 degrees to smaller than 80 degrees with respect to a plane perpendicular to the reference axis Cx that extends in the direction of the c-axis of group III nitride semiconductor. As a result, although the semiconductor epitaxial layer has an indium content ranging from 0.35 to 0.65, the epitaxial semiconductor layer has a small variation in indium composition. In the substrate 13 having the inclination angle described above, the primary surface 13a has a surface morphology M1 including narrow terraces as shown in FIG. 1. Since the group III nitride semiconductor epitaxial region 15 is provided on the substrate 13, the crystal axes of the group III nitride semiconductor epitaxial region 15 are in succession to the crystal axes of the substrate 13, i.e., epitaxially. Consequently, the primary surface 15a of the group III nitride semiconductor epitaxial region 15 also tilts toward the m-axis at a tilt angle in the range of not less than 63 degrees and less than 80 degrees with respect to a plane perpendicular to the reference axis Cx, and the primary surface 15a of the group III nitride semiconductor epitaxial region 15 also has a surface morphology M2 including narrow terraces. The arrangement of the terraces constitutes micro steps. Since the terraces in the tilt angle described above have a narrow width, it is not likely to non-uniform indium distribution over the terraces, avoiding segregation of indium that causes poor emission characteristics.

Since the terrace structure is associated with the inclination angle from the c-axis, the deterioration of emission characteristics is prevented in either a substrate having an inclination angle defined with respect to the (0001) plane of a first group-III nitride semiconductor or a substrate having an inclination angle defined with respect to the (000−1) plane of a first group-III nitride semiconductor. In other words, the deterioration of emission characteristics is prevented when the reference axis Cx extends in either direction of the [0001] axis or [000−1] axis of the first group-III nitride semiconductor.

In the group III nitride semiconductor optical device 11a, preferably the primary surface 13a of the substrate 13 tilts toward the m-axis of the first group-III nitride semiconductor at a tilt angle in the range of not less than 70 degrees to less than 80 degrees from a plane perpendicular to the reference axis. The primary surface 13a of the substrate in such an angle range has further narrowed terraces, which can prevent emission characteristics of the active layer 17 from decreasing due to the indium segregation in the group III nitride semiconductor optical device 11a.

With reference to FIG. 1, a coordinate system S is shown. The primary surface 13a of the substrate 13 is oriented to the Z-axis, and extends in the X- and Y-directions. The direction of the X-axis corresponds to the direction of the a-axis.

The group III nitride semiconductor epitaxial region 15 may include one or more group III nitride semiconductor layers of a first conductive type. In the embodiment, the group III nitride semiconductor epitaxial region 15 includes an n-type GaN semiconductor layer 23 and an n-type InGaN semiconductor layer 25 that are arranged in the Z-direction. Since the n-type GaN semiconductor layer 23 and the n-type InGaN semiconductor layer 25 are epitaxially grown on the primary surface 13a of the substrate 13, a primary surface 23a of the n-type GaN semiconductor layer 23 and a primary surface 25a of the n-type InGaN semiconductor layer 25 (which is equivalent to the surface 15a in the embodiment in this example) also have morphologies including terrace structures M3 and M2, respectively.

Each of the morphologies M1, M2 and M3 has micro steps arranged in the direction of the c-axis inclination. These micro steps extend in the direction that crosses the tilt direction. Major constituent surfaces of the micro steps include at least the m-plane and the plane {10-11}. The constituent surfaces and the step edges have an excellent indium incorporation.

The group III nitride semiconductor optical device 11a may include a group III nitride semiconductor region 21 disposed on the active layer 17. The group III nitride semiconductor region 21 may include one or more group III nitride semiconductor layers of a second conductive type. The group III nitride region 21 includes an electron blocking layer 27 and a contact layer 29, which are arranged in the Z-direction. The electron blocking layer 27 may comprise, for example, GaN or AlGaN, and the contact layer 29 may comprise, for example, p-type GaN or p-type AlGaN.

Preferably, the active layer 17 has a single quantum well structure. In this device 11a, the well layer providing an emission of a wavelength ranging from red to infrared has an indium content of not less than 0.3. The well layer comprising an InGaN layer is highly strained. High strain may create defects in an InGaN layer. In contrast, the active layer 17 of a single quantum well structure does not include a stack of well layers highly strained, and thus exhibits high crystallinity. In addition, since the well layer 17 producing long-wavelength light has a deep quantum well, a carrier distribution over the quantum wells is nonuniform in multiple quantum wells. Therefore, a single quantum well is preferred.

The active layer 17 may include a quantum well structure 31. The quantum well structure 31 may include a barrier layer 35, a well layer 33 and another barrier layer 35, which are arranged in sequence in the direction of the axis Ax. In the embodiment, the well layer 33 is made of an epitaxial semiconductor layer 19, which comprises, for example, InGaN or InAlGaN. The barrier layer 35 is made of a group III nitride semiconductor, which comprises, for example, GaN, InGaN, and InAlGaN. The n-type group III nitride semiconductor layers 23 and 25, the active layer 17, and the group III nitride semiconductor layers 27 and 29 are arranged in the direction of the axis Ax. The direction of the reference axis Cx is different from the direction of the axis Ax. The group III nitride semiconductor optical device 11a achieves suppressed indium segregation not only in the epitaxial semiconductor layer of a single bulk film but also in the quantum well structure 31.

The active layer 17 may be provided to produce light having a wavelength in the range of not shorter than 650 nm and not more than 800 nm. In the group III nitride semiconductor optical device 11a, the active layer 17 for producing light of a wavelength in the range from 650 nm to 800 nm includes a well layer with a high indium content, which provides a small variation in the indium content in the well layer. Since emission in such a long-wavelength range requires the well layer to have a high indium content in the range of 0.4 to 0.6, a crystal plane having significant indium segregation, such as the c-plane, the m-plane or the plane (10-11), noticeably decreases the intensity of emission. In contrast, indium segregation is reduced in a tilt angle range in the present embodiment, so that a decrease in emission intensity is reduced even in a long-wavelength range of longer than 650 nm.

Preferably, the primary surface 13a of the substrate 13 tilts at a tilt angle of not smaller than 70 degrees toward the direction of the m-axis of the group III nitride semiconductor with respect to a plane perpendicular to the reference axis Cx. A variation in the indium distribution can be further reduced on the substrate of the primary surface having a tilt angle of not smaller than 70 degrees.

More preferably, the primary surface 13a of the substrate 13 tilts toward the m-axis of the group III nitride semiconductor at a tilt angle in the range of not less than 71 degrees and not more than 79 degrees with respect to a plane perpendicular to the reference axis Cx. In such an angle range, the step edge growth becomes predominant, thereby further reducing the indium segregation.

The group III nitride semiconductor optical device 11a may include a first electrode 37 (e.g. an anode) disposed on a contact layer 29. The first electrode 37 may include a transparent electrode covering the contact layer 29. In a typical example, the transparent electrode is made of Ni/Au. The group III nitride semiconductor optical device 11a may include a second electrode 39 (e.g. a cathode) on the backside 13b of the substrate 13. The second electrode 39 comprises, for example, Ti/Al.

The active layer 17 generates light L1 in response to an external voltage applied across electrodes 37 and 39. In the embodiment, the group III nitride semiconductor optical device 11a encompasses a surface-emitting device. In the active layer 17 in the present embodiment, the piezoelectric field effect is small compared to that of the c-plane.

Preferably, the off angle $A_{OFF}$ in the direction of the a-axis of the substrate 13 has a value that is not zero. The off angle $A_{OFF}$ inclined in the direction of the a-axis provides satisfactory surface morphology of the epitaxial region. The off angle $A_{OFF}$ is defined in the plane XZ. Preferably the off angle. $A_{OFF}$ of the group III nitride semiconductor is, for example, in the range of −3 degrees to +3 degrees. The primary surface 13a of the substrate 13 may be composed of a semiconductor surface that tilts toward the direction of the m-axis of the group III nitride semiconductor at a tilt angle in the range from −3 degrees to +3 degrees with respect to either plane {20-21} or {20-2-1} of the group III nitride semiconductor. In such a surface orientation and such a range of tilt angle, both incorporation and segregation of indium are well balanced, thereby forming a well layer having an excellent crystalline structure. Specifically, a preferred off angle $A_{OFF}$ is, for example, in the range of −3 degrees to −0.1 degrees or +0.1 degrees to +3 degrees. An off angle $A_{OFF}$, for example, in the range of −0.4 degrees to −0.1 degrees or +0.1 degrees to +0.4 degrees produces further satisfactory surface morphology.

Figure 2:
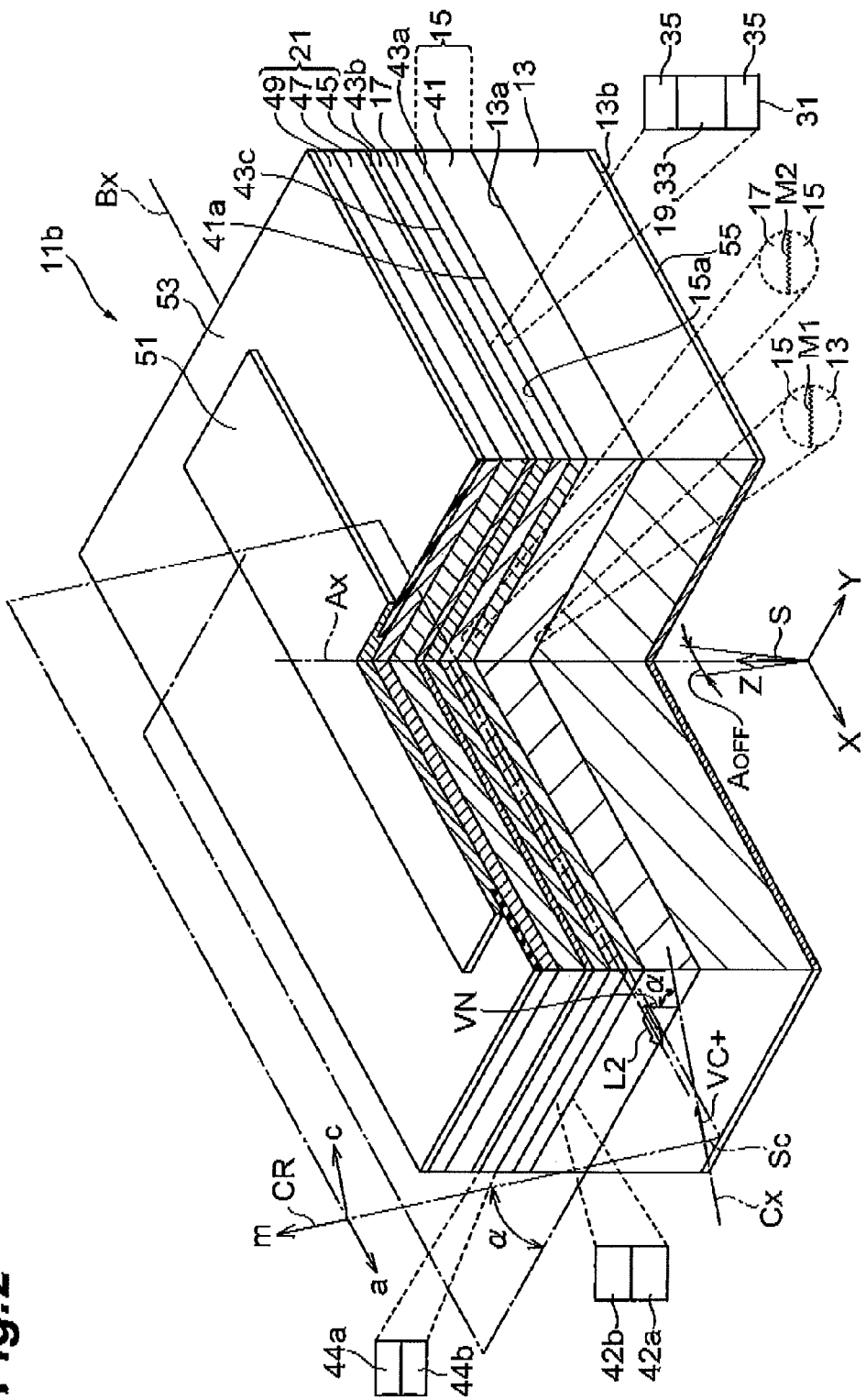
FIG. 2 is a schematic view illustrating the structure of a group III nitride semiconductor optical device in accordance with an embodiment of the present invention.

FIG. 2 is a schematic view illustrating the structure of a group III nitride semiconductor optical device in accordance with another embodiment of the present invention. In a typical example, the group III nitride semiconductor optical device 11b encompasses a semiconductor laser. The group III nitride semiconductor optical device 11b includes a substrate 13, a group III nitride semiconductor epitaxial region 15, and an active layer 17, as is the case with the group III nitride semiconductor optical device 11a. The c-plane of the substrate 13 extends along a surface Sc shown in FIG. 2. The coordinate system CR (c-axis, a-axis, and m-axis) is shown on the surface Sc. The primary surface 13a of the substrate 13 tilts at a tilt angle in the range of 63 degrees to smaller than 80 degrees toward the direction of the m-axis of the first group-III nitride semiconductor with respect to a plane perpendicular to the reference axis Cx that extends along the c-axis of the first group-III nitride semiconductor. The tilt angle α is formed by the reference axis Cx and the normal vector VN defined on the primary surface 13a of the substrate 13. The angle α is equal to an angle defined by vector VC+ and the vector VN in the embodiment. The group III nitride semiconductor epitaxial region 15 is provided on the primary surface 13a. The active layer 17 includes at least one epitaxial semiconductor layer 19. The active layer 17 is provided to produce light having a wavelength in the range of not less than 580 nm and not more than 800 nm. The epitaxial semiconductor layer 19 has an indium content ranging from 0.35 to 0.65. The epitaxial semiconductor layer 19 is disposed on the group III nitride semiconductor epitaxial region 15. The epitaxial semiconductor layer 19 includes a second group-III nitride semiconductor that contains indium as a constituent element. The thickness direction of the epitaxial semiconductor layer 19 tilts with respect to the reference axis Cx. The reference axis Cx may be oriented in the direction of the axis [0001] or [000-1] of the first group-III nitride semiconductor. In the embodiment, the reference axis Cx is oriented to the direction of the vector VC+. As a result, the vector VC- is oriented to the direction of the axis [000-1]. The off angle $A_{OFF}$ is also shown in FIG. 2. The off angle $A_{OFF}$ is an angle within the plane XZ.

The primary surface 13a of the substrate 13 in the group III nitride semiconductor device 11b has a surface morphology M1, which has narrow terraces as shown in FIG. 2. A group III nitride semiconductor epitaxial region 15 is disposed on the substrate 13. The crystal axes of the group III nitride semiconductor epitaxial region 15 corresponds to the crystal axes of the substrate 13. Consequently, the primary surface 15a of the GaN-based semiconductor epitaxial region 15 also tilts toward the m-axis at a tilt angle in the range of 63 degrees to smaller than 80 degrees with respect to a plane perpendicular to the reference axis Cx. Accordingly, the primary surface 15a of the group III nitride semiconductor epitaxial region 15 also has a surface morphology M2 that includes narrow terraces. The arrangement of the terraces constitutes micro steps. Since the terraces in the tilt angle described above have a narrow width, nonuniform indium distribution is not likely to occur throughout the terraces, resulting in suppressing a deterioration of emission characteristics due to segregation of indium.

In an embodiment of the group III nitride semiconductor optical device 11b, the group III nitride semiconductor epitaxial region 15 includes an n-type cladding layer 41. The n-type cladding layer 41 and an optical guide layer 43a are arranged in the direction of the axis Ax (Z-direction). The n-type cladding layer 41 may comprise, for example, InAlGaN, AlGaN or GaN. Since the n-type cladding layer 41 and the optical guide layer 43a are epitaxially grown on the primary surface 13a of the substrate 13, the primary surface 41a of the n-type cladding layer 41 and the primary surface 43c of the optical guide layer 43a (which is equivalent to a surface 15a in the embodiment) have respective surface morphologies each having a terrace structure. Such morphology has micro steps arranged in the direction tilting from the c-axis. These micro steps extend in the direction that intersects with the tilt direction. Major constituent surfaces of the micro steps encompasses at least the m-plane and {20-21} and {10-11} planes. These constituent surfaces and the step edges exhibit excellent indium incorporation.

The group III nitride semiconductor region 21 of the group III nitride semiconductor optical device 11b includes an electron blocking layer 45, a cladding layer 47, and a contact layer 49. The optical guide layer 43b, the electron blocking layer 45, the cladding layer 47 and the contact layer 49 are arranged in the Z-direction. The electron blocking layer 45 may comprise, for example, GaN or AlGaN. The cladding layer 47 may comprise, for example, p-type InAlGaN, p-type AlGaN or p-type GaN. The contact layer 49 may comprise, for example, p-type GaN or p-type InGaN.

When the group III nitride semiconductor optical device 11b includes the electron blocking layer 45 provided between an active layer 17 and a group III nitride semiconductor region 21, it is preferable that the electron blocking layer 45 be composed of the same material as the substrate 13. The electron blocking layer 45 made of the same as material of the substrate 13 can make strain in the electron blocking layer small. Accordingly, the substrate 13 and the electron blocking layer 45 may comprise for example GaN.

The group III nitride semiconductor optical device 11b may include a first electrode 51 (e.g. an anode) disposed on the contact layer 49. The first electrode 51 is connected to the contact layer 49 through a stripe window of an insulating film 53 that covers the contact layer 49. For example, Ni/Au is used for the first electrode 51. The group III nitride semiconductor optical device 11b may include a second electrode 55 (e.g. a cathode) disposed on a backside 13b of the substrate 13. The second electrode 55 comprises, for example, Ti/Al.

The active layer 17 generates light L2 in response to an external voltage applied to electrodes 51 and 55. In the embodiment, the group III nitride semiconductor optical device 11b includes a surface-emitting device. In the active layer 17, the direction of the Z-component of the piezoelectric field (a component in the direction of the axis Ax) is opposite to the direction from the p-type group III nitride semiconductor layers 43a, 45, 47 and 49 to the n-type group III nitride semiconductor layers 41 and 43a. In the group III nitride semiconductor optical device 11b, since the direction of the Z-component of the piezoelectric field is opposite to the direction of the external voltage that is applied across the electrodes 51 and 55, the shift of the emission wavelength is made reduced.

In the group III nitride semiconductor optical devices 11a and 11b, preferably the off angle $A_{OFF}$ in the direction of the a-axis of the substrate 13 has a value that is not zero. The off angle $A_{OFF}$ in the direction of the a-axis provides satisfactory surface morphology of the epitaxial region. The off angle $A_{OFF}$ of the group III nitride semiconductor may be, for example, in the range of −3 degrees to +3 degrees. Specifically, the preferred off angle $A_{OFF}$ is, for example, in the range of −3 degrees to −0.1 degrees or +0.1 degrees to +3 degrees. An off angle $A_{OFF}$, for example, in the range of −0.4 degrees to −0.1 degrees or +0.1 degrees to +0.4 degrees produces further satisfactory surface morphology.

In the group III nitride semiconductor optical devices 11a and 11b, preferably the active layer 17 has a single quantum well structure. In the device 11a, the well layer producing an emission in the wavelength range from red to infrared has an indium content that is not smaller than 0.3. The well layer of an InGaN layer is highly strained, and this may produce defects in the InGaN layer. In contrast, the active layer 17 of the single quantum well structure does not include any stack of well layers that incorporate high strain, and thus exhibits excellent crystallinity. In addition, since the well layer 17 producing long-wavelength light has a deep quantum well, multiple quantum well structure causes a nonuniform carrier distribution over the quantum wells. As a result, a single quantum well is preferred.

The active layer 17 may include a quantum well structure 31, which may include a barrier layer 35, a well layer 33 and a barrier layer 35, which are arranged in sequence in the direction of the axis Ax. In the embodiment, the well layer 33 includes an epitaxial semiconductor layer 19 comprising, for example, InGaN or InAlGaN. Each barrier layer 35 includes a group III nitride semiconductor which may comprises, for example, GaN, InGaN and InAlGaN. The n-type group III nitride semiconductor layers 23 and 25, the active layer 17, and the group III nitride semiconductor layers 27 and 29 are arranged in the direction of the axis Ax. The direction of the reference axis Cx is different from the direction of the axis Ax. The group III nitride semiconductor optical device 11a achieves small indium segregation not only in the epitaxial semiconductor layer of a monolayer film but also in the quantum well structure 31.

The active layer 17 may be provided to produce light having a wavelength in the range of not shorter than 650 nm and not less than 800 nm. In the group III nitride semiconductor optical device 11a, the active layer 17 for producing light of a wavelength in the range of not shorter than 650 nm and not more than 800 nm includes a well layer with a high indium content, which provides a small variation in the indium content in the well layer. Since emission in such a long-wavelength range requires the well layer to have a high indium content, a crystal plane having significant indium segregation, such as the c-plane, the m-plane or the plane (10-11), noticeably decreases the intensity of emission. In contrast, indium segregation is reduced at a tilt angle in the range of the present embodiment, so that a decrease in emission intensity is reduced even in a long-wavelength range of longer than 480 nm. Preferably, the well layer has a thickness of, for example, not larger than 2.5 nm.

Preferably, the primary surface 13a of the substrate 13 tilts toward the m-axis of the group III nitride semiconductor at a tilt angle of 70 degrees or more with respect to the plane perpendicular to the reference axis Cx. The primary surface of the substrate having a tilt angle of not less than 70 degrees can further reduce a variation in the indium distribution.

More preferably, the primary surface 13a of the substrate 13 tilts toward the m-axis of the group III nitride semiconductor at a tilt angle in the range of 71 degrees to 79 degrees with respect to the plane perpendicular to the reference axis x. Step edge growth is dominant in the range of the above tilt angle, thereby further reducing segregation of indium.

In the group III nitride semiconductor optical device 11b, the first optical guide layer 43a is disposed between the active layer 17 and the group III nitride semiconductor region 15, and the second optical guide layer 43b is disposed between the active layer 17 and the group III nitride semiconductor region 21. Preferably the first optical guide layer 43a and the second optical guide layer 43b have a total thickness of not smaller than 0.7 μm. In the laser diode, the first and second optical guide layers 43a and 43b with a total thickness of not smaller than 0.7 μm enable suitable optical confinement in an emission region that is constituted by the first and second optical guide layers 43a and 43b and the active layer 17 of the well layer 19 with a high indium content and a small indium variation.

For example, when the substrate 13 is made of GaN, preferably the first optical guide layer 43a includes an $In_{X1}Al_{Y1}Ga_{1-X1-Y1}N$ ($0 \leq X1 \leq 1$, $0 \leq Y1 \leq 1$) layer and a GaN layer, and preferably the second optical guide layer 43b includes an $In_{X2}Al_{Y2}Ga_{1-X2-Y2}N$ ($0 \leq X2 \leq 1$, $0 \leq Y2 \leq 1$) layer and a GaN layer.

Preferably the first optical guide layer 43a includes a first group-III nitride semiconductor layer containing indium as a group III element, and the second optical guide layer 43b includes a second group-III nitride semiconductor layer containing indium as a group III element, the first and second group-III nitride semiconductor layers with an indium content of higher than 0.02. Since each of the first and second group-III nitride semiconductor layers has an indium content of higher than 0.02, a difference in the indium content between the well layer and the optical guide layers 43a and 43b can be made reduced. Although the lattice constant of the well layer is greatly different from the lattice constant of the cladding layer, the optical guide layers 43a and 43b allows a graded change in the lattice constant therebetween. Since these optical guide layers 43a and 43b include a group III nitride semiconductor layer containing indium as a group III element, a suitable difference in the refractive index between the active layer 17 and the cladding layers 41 and 47 can be provided. Preferably, a total thickness of the first and second optical guides 43a and 43b is not smaller than 0.9 μm. The first and second optical guides 43a and 43b have a total thickness of not smaller than 0.9 μm can readily achieve optical confinement into the active layer 17 and the optical guide layers 43a and 43b.

The first optical guide layer 43a includes a first optical guide portions 42a and a second optical guide portion 42b. The first optical guide portion 42a comprises a group III nitride semiconductor and the second optical guide portion 42b comprises a group III nitride semiconductor. The lattice constant inherent in the group III nitride semiconductor of the second optical guide 42b is larger than the lattice constant inherent in the group III nitride semiconductor of the first optical guide 42a. In addition, the refractive index of the second optical guide 42b is larger than that of the first optical guide 42a. The first optical guide 42a is disposed between the second optical guide 42b and the group III nitride semiconductor region 15. The second optical guide 42b may be disposed between the first optical guide 42a and the active layer 17. This structure can readily achieve optical confinement by a gradual change in the refractive index. Preferably, the second optical guide 42b includes an InGaN layer, and the first optical guide 42a includes at least one of an InGaN layer, an InAlGaN layer, an InAlN layer and a GaN layer. By this combination, a region between the cladding layer 41 and the active layer 19 can be provided with a preferred refractive-index profile. Alternatively, the second optical guide 42b may include an InAlN layer, and the first optical guide 42a includes at least one of an InGaN layer, an InAlGaN layer, an InAlN layer and a GaN layer. By this combination, a region between the cladding layer 41 and the active layer 19 can be provided with a preferred refractive-index profile.

The first optical guide layer 43a may include a first InGaN layer having an indium content of 0.07 or more. Such a configuration can ensure suitable optical confinement in the active layer 17 and the optical guide layers 43a and 43b. The second optical guide layer 43b may include a second InGaN layer having an indium content of 0.07 or more. Such a configuration can ensure suitable optical confinement in the active layer 17 and the optical guide layers 43a and 43b.

Preferably the first optical guide layer 43a includes a first InAlN layer having a larger refractive index than that of GaN. Since InAlN contains indium element having an atomic radius larger than that of gallium and aluminum element having an atomic radius smaller than that of gallium, the lattice constant and the band gap can be changed independent of each other by adjusting the indium content and the aluminum content. As a result, InAlN can be used as an optical guide layer. Preferably, the first InAlN layer has a lattice constant that is matched to that of GaN. Since InAlN has band gap bowing, InAlN having a composition lattice-matched to GaN exhibits a higher refractive index than that of GaN. As a result, InAlN is suitable for adjusting the refractive index and the lattice constant of the optical guide layer.

Preferably the second optical guide layer 43b includes a second InAlN layer having a larger refractive index than that of GaN. Since the refractive index of the second InAlN layer is larger than that of GaN, an optical guide layer suitable for an active layer having a large indium content can be provided by adjustment of the lattice constant. Preferably, the second InAlN layer has a lattice constant that is lattice-matched to GaN. The second optical guide layer 43b may have the same structure as that of the first optical guide layer 43a. For example, the second optical guide layer 43b includes the first and second optical guide portions 44a and 44b. The group III nitride semiconductor is used as material for the first optical guide layers 43a and 43b.

In the optical guide layers 43a and 43b each including at least two semiconductor layers, the following combinations may be used as the above optical guide layers: InGaN/InGaN, InGaN/InAlGaN, InAlN/GaN, InAlN/InAlGaN, InGaN/InAlN, and InAlN/InGaN.

Example 1

Figure 3:
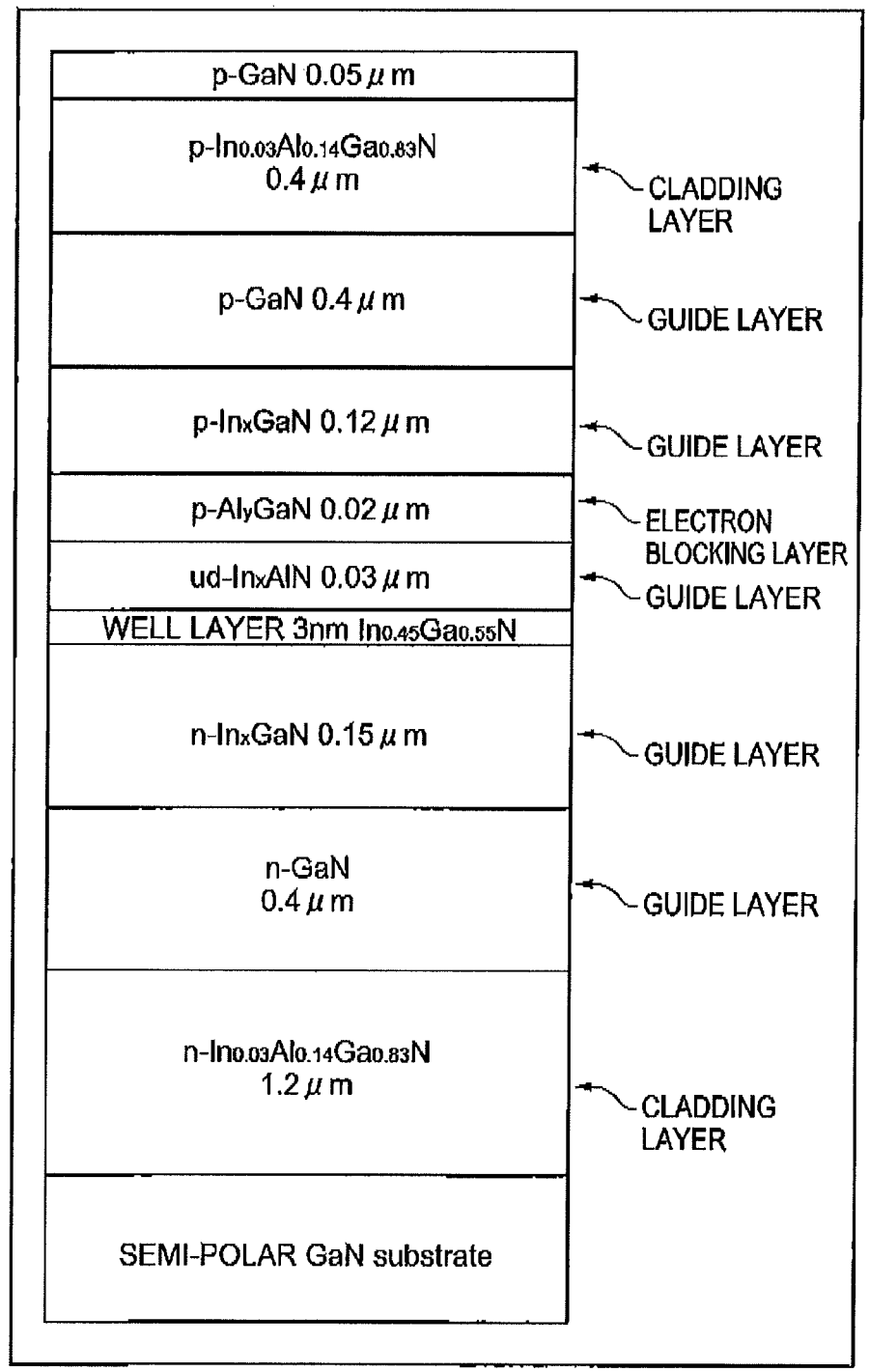
FIG. 3 is a drawing illustrating a planar optical waveguide model for calculation of an electric field distribution.
Figure 4:
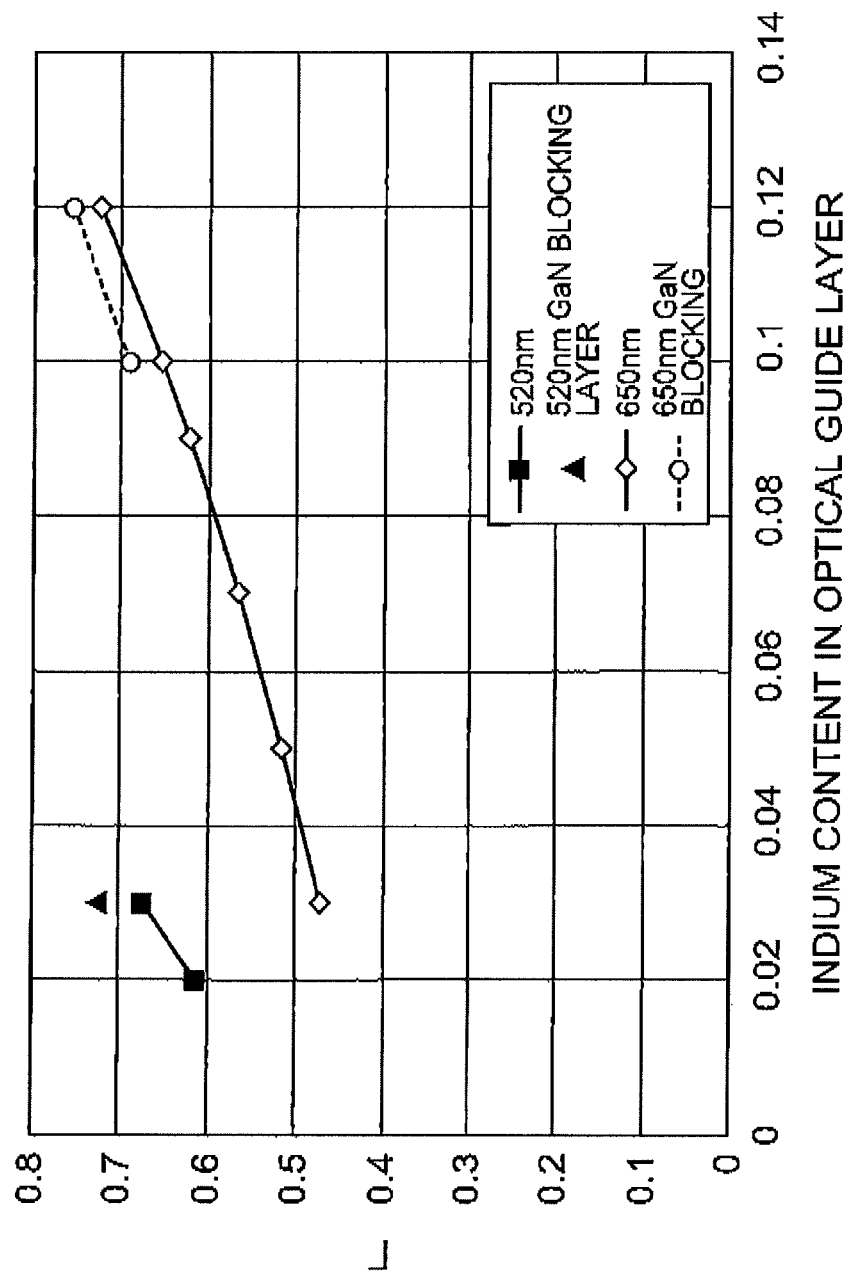
FIG. 4 is a graph illustrating optical confinement coefficients (Γwell) estimated from the calculated electric field distribution.

In order to estimate a composition required for optical guide layers, an electric field distribution is calculated using a planar optical waveguide structure shown in FIG. 3. FIG. 4 is a graph illustrating optical confinement coefficients $\Gamma$ evaluated by the calculation. The optical confinement coefficient $\Gamma$ is defined as the ratio of the electric field intensity in a well layer to the electric field intensity of the entire light. The effect of the composition of an electron blocking layer is estimated.

(1) In the electron blocking layer having an aluminum content y of 0.12.

In InGaN of the optical guide layer having an indium content x of 0.03, when the emission wavelength is changed from green (520 nm) to red (650 nm), an optical confinement coefficient $\Gamma$ in the InGaN well layer decrease from 0.67 to 0.47. In contrast, an increase in the indium content in the InGaN layer of the optical guide layer leads to an increased optical confinement coefficient $\Gamma$. Since the InGaN layer in the optical guide layer needs to have an indium content of at least 0.02 for lasing at a wavelength of 520 nm, the estimated indium content required for lasing at a wavelength of 600 nm is in a rage of 0.07 to 0.08.

The estimated indium content of the InGaN layer in the optical guide layer is not higher than 0.13 in consideration of the critical film thickness of the InGaN layer. Such a range of the indium in the InGaN layer corresponds to a photoluminescence wavelength of 392 nm to 429 nm or an energy level of 2.89 eV to 3.16 eV, respectively.

(2) The electron blocking layer having an aluminum content of zero:

The optical confinement coefficient $\Gamma$ can be made increased at both wavelengths of 520 nm and 650 nm. A possible reason for the increase is as follows: a high aluminum content in the electron blocking layer causes an unsymmetrical electric field distribution between the n-side and the p-side. An indium content of the optical guide layer is made high for the emission in the 650 nm band, so that the electron blocking layer with a low band gap can prevent electrons from overflowing. Accordingly, GaN may be used as material for the electron blocking layer. In this example, the electron blocking layer is lattice-matched to the substrate to exhibit excellent crystallinity.

Example 2

InAlN is a group III nitride semiconductor having a large band gap bowing. In view of the use of InAlN, the following estimation is carried out. When InAlN (lattice-match condition is: an indium content of 0.177 to 0.261) is lattice-matched to GaN, InAlN in this range of the indium content has a band gap of 2.8 eV, which is lower than that of GaN (For example, the lattice-match condition in the a-axis is satisfied, the indium content for the relevant lattice constant is 0.177). Accordingly, InAlN having a composition for the lattice match or approximate lattice match to GaN can be used as an optical guide layer having a high refractive index.

Figure 5:
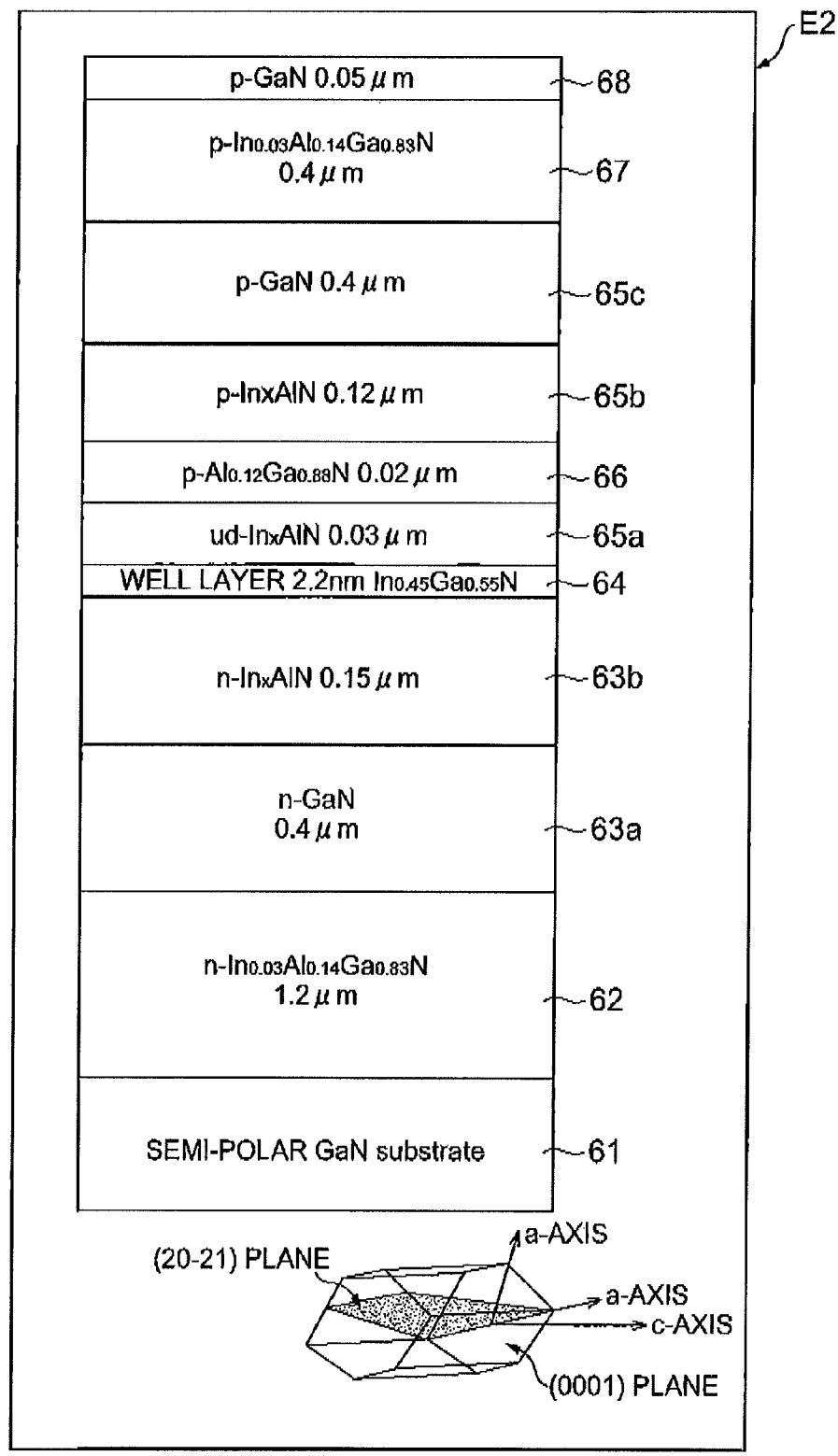
FIG. 5 is a drawing illustrating the structure of an epitaxial substrate in Example 2.

Explanation of lattice relaxation of InAlN is made as below. An epitaxial substrate E2 shown in FIG. 5 is fabricated using a semi-polar GaN substrate having the c-plane tilting toward the m-axis at an angle of, for example, 75 degrees (the plane orientation of which is equivalent to the {20-21} plane). The epitaxial substrate E2 includes an n-type substrate 61, an n-type cladding layer 62, an n-type GaN optical guide layer 63a, an n-type $In_XAl_{1-X}N$ optical guide layer 63b, an $In_{0.45}Ga_{0.55}N$ well layer 64, an undoped $In_XAl_{1-X}N$ optical guide layer 65a, a p-type $Al_{0.12}Ga_{0.88}N$ electron blocking layer 66, a p-type $In_XAl_{1-X}N$ optical guide layer 65b, a p-type GaN optical guide layer 65c, a p-type cladding layer 67, and a p-type contact layer 68. In order to determine whether the lattice relaxation is present, X-ray reciprocal space mapping of the epitaxial substrate is carried out by X-ray diffraction. In the epitaxial substrate E2, the total thickness of the InAlN layers is 0.3 μm, and a composition of the quaternary InAlGaN cladding layer (which has a thickness of 1.2 μm) satisfies a lattice-matching condition for the GaN substrate.

The result of the X-ray reciprocal space mapping shows that InAlN remains without lattice relaxation when a degree of lattice mismatch defined in the primary plane in which the InAlN layer extends is in the range of −1.5% to +1.5%. Beyond this range, dislocation may occur in the c-plane, and potential lattice-relaxation is caused therein.

InAlN has a large difference in the lattice constant ratio c/a between InN and AlN. For example, AlN has a ratio c/a of 1.601, and InN has a ratio c/a of 1.623. Accordingly, the respective compositions allowing the lattice-match to the c-axis and a-axis are significantly different from each other. The composition allowing the lattice-match to the a-axis has an indium content of 17.7%, while the composition allowing the lattice-match to the c-axis has an indium content of 26.1%. In the plane orientation such as the plane {20-21} plane and the m-plane which are semi-polar and non-polar planes, respectively, and greatly tilts from the c-plane, the degrees of lattice-match in both of the a-axis and the c-axis are important because both the a-axis and the c-axis of InAlN are in parallel or approximately parallel to the primary surface of the substrate. For the degree of lattice-mismatch within the range as described, the composition has an indium content of 16% (Δa=−0.3%, Δc=−1.5%) to 29% (Δa=+1.5%, Δc=+0.4%). InAlN in such a composition range has a band gap of 3.16 to 2.72 eV. The InGaN layer corresponding to the band gap has an indium content of 0.6 to 0.16.

Accordingly, InAlN having a lower degree of lattice mismatch compared to InGaN can provide a wide range of the band gap, or the refractive index. In addition, InAlN can achieve a smaller band gap or higher refractive index compared to InGaN. Consequently, InAlN can demonstrate: an optical guide layer has a higher crystallinity and higher refractive index as compared to InGaN; difference in the refractive index between a cladding layer and an optical guide layer can be made larger; and laser having a longer wavelength than orange can be achieved.

Example 3

Figure 6:
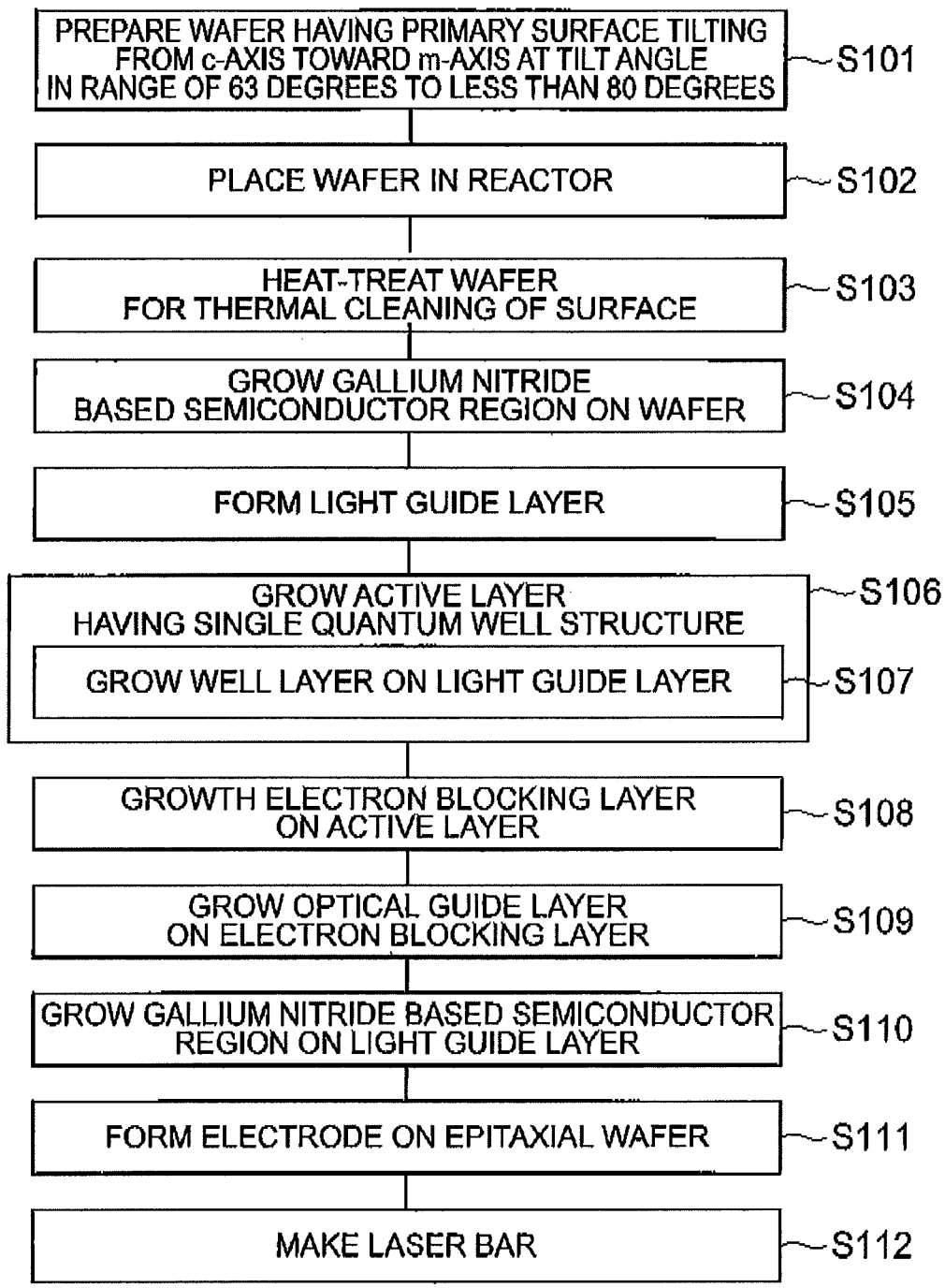
FIG. 6 is a process flow chart in Example 3.
Figure 7:
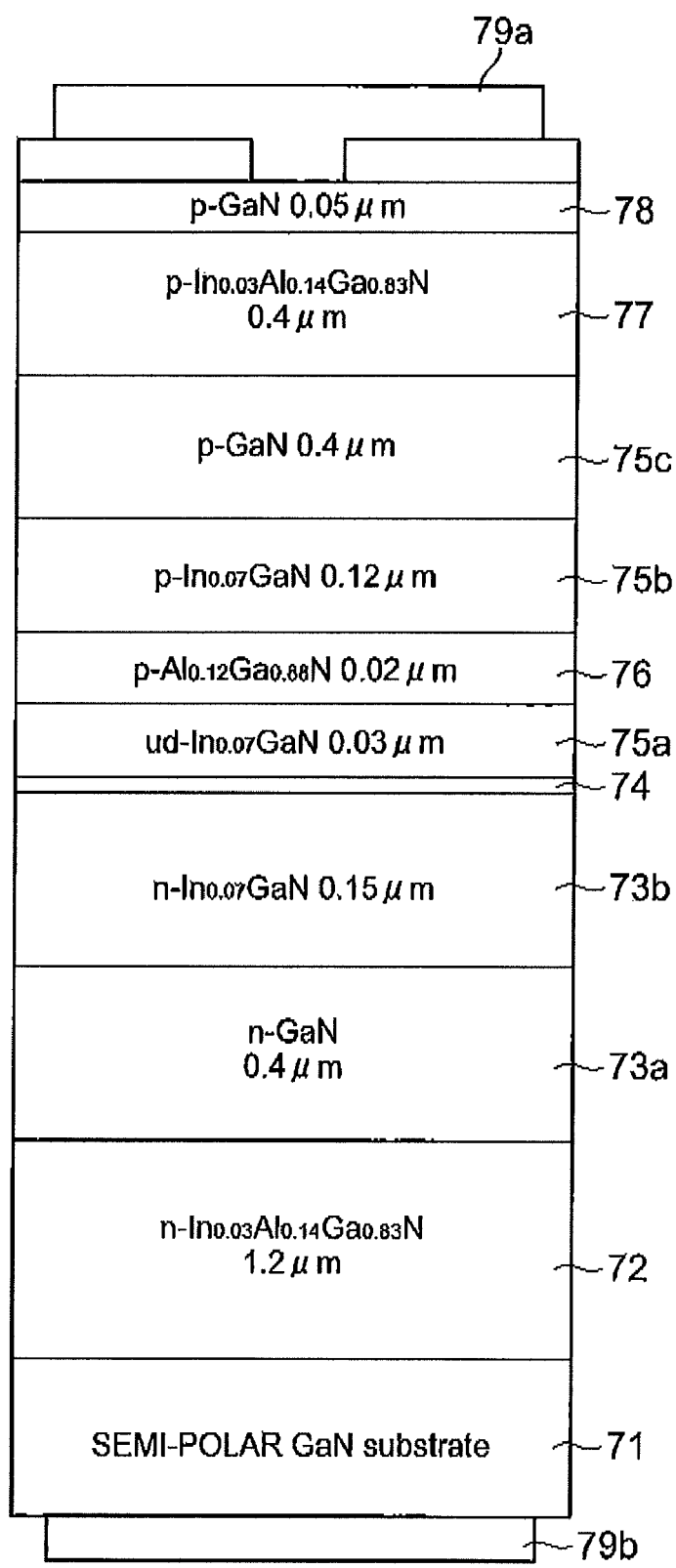
FIG. 7 is a drawing illustrating the structure of a laser diode in Example 3.

With reference to a process flow chart in FIG. 6, a laser diode shown in FIG. 7 is fabricated. In Step 101, a GaN substrate 71 is prepared, and has a semi-polar surface tilting from the c-plane toward the m-axis at an angle of 75 degrees. This plane orientation is equivalent to the plane {20-21}. In Step 102, a GaN substrate 71 is loaded to a growth reactor. In Step 103, the substrate 71 is heat-treated at a temperature of 1050 degrees Celsius under a pressure of 27 kPa for 10 minutes while supplying $NH_3$ and $H_2$ to the reactor. Through this surface modification by the heat treatment, a terrace structure that depends on an off angle is formed on the surface of the substrate. After the heat treatment, in Step 104, a group III nitride semiconductor region is grown. In Step 104, an n-type InAlGaN layer 72 having a thickness of 1.2 μm is grown on a semi-polar GaN surface at a temperature of 920 degrees Celsius. The layer has an indium content of 0.03 and an aluminum content of 0.14. In the subsequent Step 105, after the substrate temperature is changed to 1050 degrees Celsius, an n-type GaN layer 73a having a thickness of 0.4 μm is grown on the n-type InAlGaN layer 72. Subsequently, an n-type InGaN layer 73b having a thickness of 0.15 μm is grown at a substrate temperature of 750 degrees Celsius. This InGaN has an indium content of 0.07.

In Step 106, an active layer 74 is grown on the optical guide layers 73a and 73b. This active layer 74 has a single quantum well layer. In Step 107, the growth temperature for the InGaN well layer is 690 degrees Celsius and the InGaN well layer has an indium content of 0.45. The well layer has a thickness of 2.2 nm.

In Steps 108 and 109, an optical guide layer and an electron blocking layer are grown thereon. First, an undoped InGaN layer 75a having a thickness of 0.03 μm is grown thereon at a substrate temperature of 750 degrees Celsius. This InGaN has an indium content of 0.07. Subsequently, a p-type AlGaN electron blocking layer is grown at a temperature of 880 degrees Celsius on the active layer. This electron blocking layer 76 has an aluminum content of 0.12. After the substrate temperature is changed to 750 degrees Celsius, a p-type InGaN layer 75b having a thickness of 0.12 μm is grown on the electron blocking layer 76. This InGaN has an indium content of 0.07. After the substrate temperature is changed to 880 degrees Celsius, a p-type GaN layer 75c having a thickness of 0.4 μm is further grown on the p-type InGaN layer 75b. Subsequently, in Step 110, the substrate temperature remains unchanged, a p-type InAlGaN cladding layer 77 having a thickness of 0.4 μm and a p-type contact layer 78 having a thickness of 0.05 μm are grown in sequence on the p-type GaN layer 75c. The p-type InAlGaN cladding layer 77 has an indium content of 0.03 and aluminum content of 0.14. The p-type InAlGaN cladding layer 77 is grown under a pressure of 60 kPa while the other semiconductor layers are grown under a pressure of 100 kPa. These steps complete the fabrication of an epitaxial substrate.

In Step 111, an electrode is formed on an epitaxial substrate having an LD structure. First, an insulating layer, such as a silicon oxide layer, is grown on the epitaxial substrate. A window having stripe-shape with a width of 10 μm is formed on the insulating layer by lithography and wet etching. The stripe window extends in the direction of the m-axis projected onto the primary surface of the substrate. Subsequently, an anode (e.g. Ni/Au) 79a is formed on the insulating layer and the stripe window by vacuum evaporation, while a cathode (e.g. Ti/Al) 79b is formed on a back surface of the substrate by vacuum evaporation. Pad electrodes (e.g. Ti/Au) are formed on these electrodes by vacuum evaporation. Through these steps, a substrate product is fabricated.

Subsequently, in Step 112, a laser bar having an optical cavity of 600 μm is formed to make a gain-guided laser. Multi-layer reflection films are coated on the end faces of the laser bar (the front-side reflectance of 80% and the rear-side reflectance of 95%).

This laser diode is pulse-driven at room temperature (a pulse width of 0.5 second, a duty of 0.1%), and lasing of the laser diode is observed with a lasing wavelength in a range of 650 nm to 670 nm.

Example 4

Figure 8:
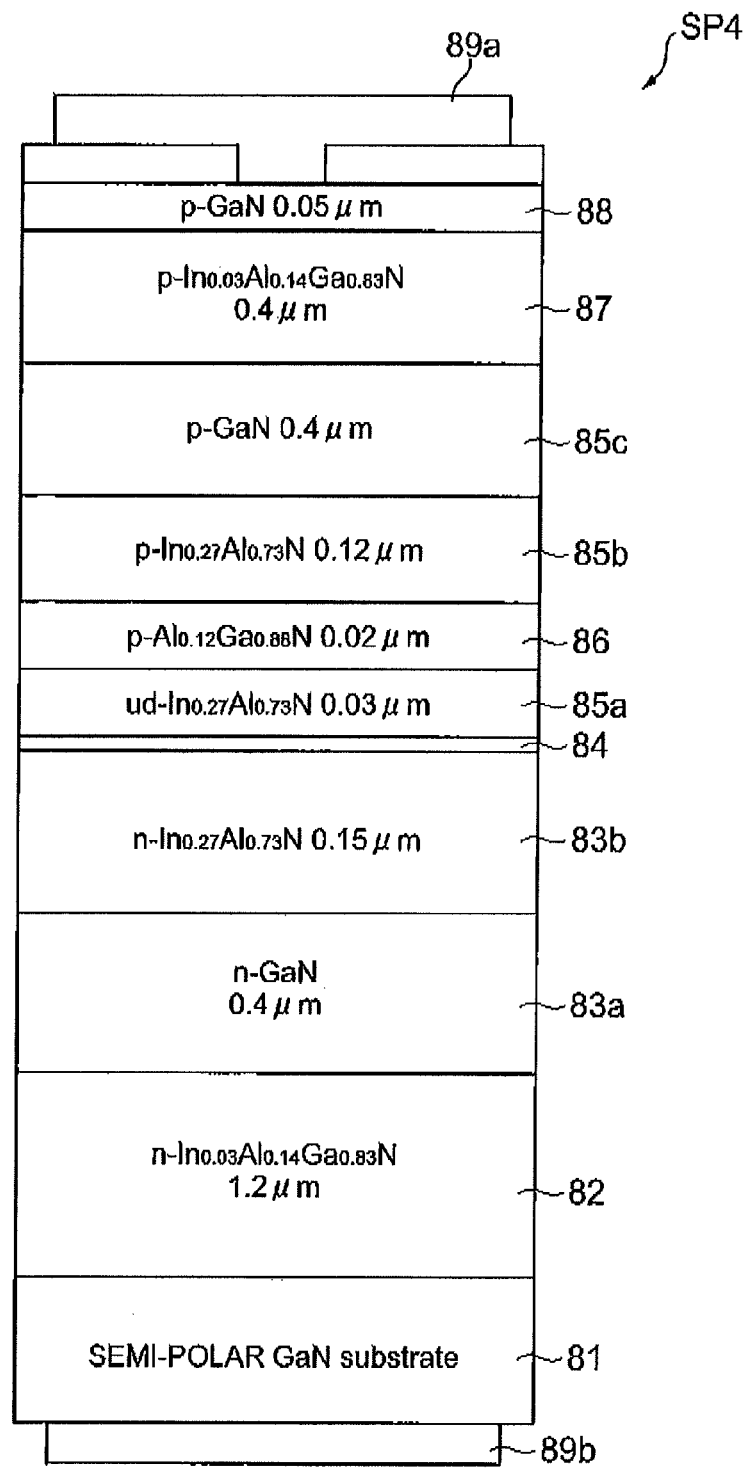
FIG. 8 is a drawing illustrating the structure of a laser diode in Example 4.

A laser diode shown in FIG. 8 is fabricated. A GaN substrate 81 is prepared and has a semi-polar surface tilting from the c-plane toward the m-axis at an angle of 75 degrees. This plane orientation is equivalent to the plane {20-21}. First, a GaN substrate 81 is placed in a growth reactor. The substrate 81 is heat-treated at a temperature of 1050 degrees Celsius under a pressure of 27 kPa for 10 minutes while supplying $NH_3$ and $H_2$ to the reactor. After the heat treatment, an n-type InAlGaN layer 82 having a thickness of 1.2 μm is grown on a semi-polar GaN surface at a temperature of 920 degrees Celsius. This layer has an indium content of 0.03 and an aluminum content of 0.14. After the substrate temperature is changed to 1050 degrees Celsius, an n-type GaN layer 83a having a thickness of 0.4 μm is grown on the n-type InAlGaN layer 82. Subsequently, an n-type InAlN layer 83b having a thickness of 0.15 μm is grown at a substrate temperature of 750 degrees Celsius. This InAlN has an indium content of 0.27.

An active layer 84 is grown over the optical guide layers 83a and 83b. This active layer 84 has a single quantum well layer. The InGaN well layer is grown at a temperature of 690 degrees Celsius and has an indium content of 0.45. The well layer has a thickness of 2.2 nm.

Subsequently, an undoped InAlN layer 85b having a thickness of 0.03 μm is grown at a substrate temperature of 750 degrees Celsius. This InAlN has an indium content of 0.27. A p-type AlGaN electron blocking layer 86 is grown at a temperature of 880 degrees Celsius on the active layer. This electron blocking layer has an aluminum content of 0.12. After the substrate temperature is changed to 750 degrees Celsius, a p-type InAlN layer 85b having a thickness of 0.12 μm is grown on the electron blocking layer 86. This InAlN has an indium content of 0.27. After the substrate temperature is changed to 880 degrees Celsius, a p-type GaN layer 85c having a thickness of 0.4 μm is grown on the p-type InGaN layer 85b. Subsequently, with a substrate temperature remaining unchanged, a p-type InAlGaN cladding layer 87 having a thickness of 0.4 μm and a p-type GaN contact layer 88 having a thickness of 0.05 μm are grown in sequence over the p-type GaN layer 85c. The p-type InAlGaN cladding layer 87 has an indium content of 0.03 and aluminum content of 0.14. The p-type InAlGaN cladding layer is grown under a pressure of 60 kPa, the InAlN layers 83b, 85a, and 85b are grown under a pressure of 40 kPa, and the other semiconductor layers are grown under a pressure of 100 kPa. Through these steps, an epitaxial substrate is fabricated.

An electrode is formed on the epitaxial substrate having an LD structure. First, an insulating layer, such as a silicon oxide layer, is grown on the epitaxial substrate. A window having a stripe-shape with a width of 10 μm is formed on the insulating layer by lithography and wet etching. The stripe window extends in the direction of the m-axis projecting on the primary surface of the substrate. Subsequently, an anode (e.g. Ni/Au) 89a is formed on the insulating layer and the striped window by vacuum evaporation, while a cathode (e.g. Ti/Al) 89b is formed by vacuum evaporation on a back surface of the substrate. A pad electrode (e.g. Ti/Au) is further grown on the anode. Through these steps, a substrate product SP4 is fabricated.

Subsequently, a laser bar having an optical cavity of 600 μm is formed to fabricate a gain-guided laser. Multi-layer reflection films are coated on end faces of the laser bar (the front-side reflectance of 80% and the rear-side reflectance of 95%).

This laser diode is pulse-driven at room temperature (a pulse width of 0.5 second, a duty of 0.1%), and lasing of the laser diode is observed with a lasing wavelength of 650 nm to 670 nm.

Example 5

Figure 9:
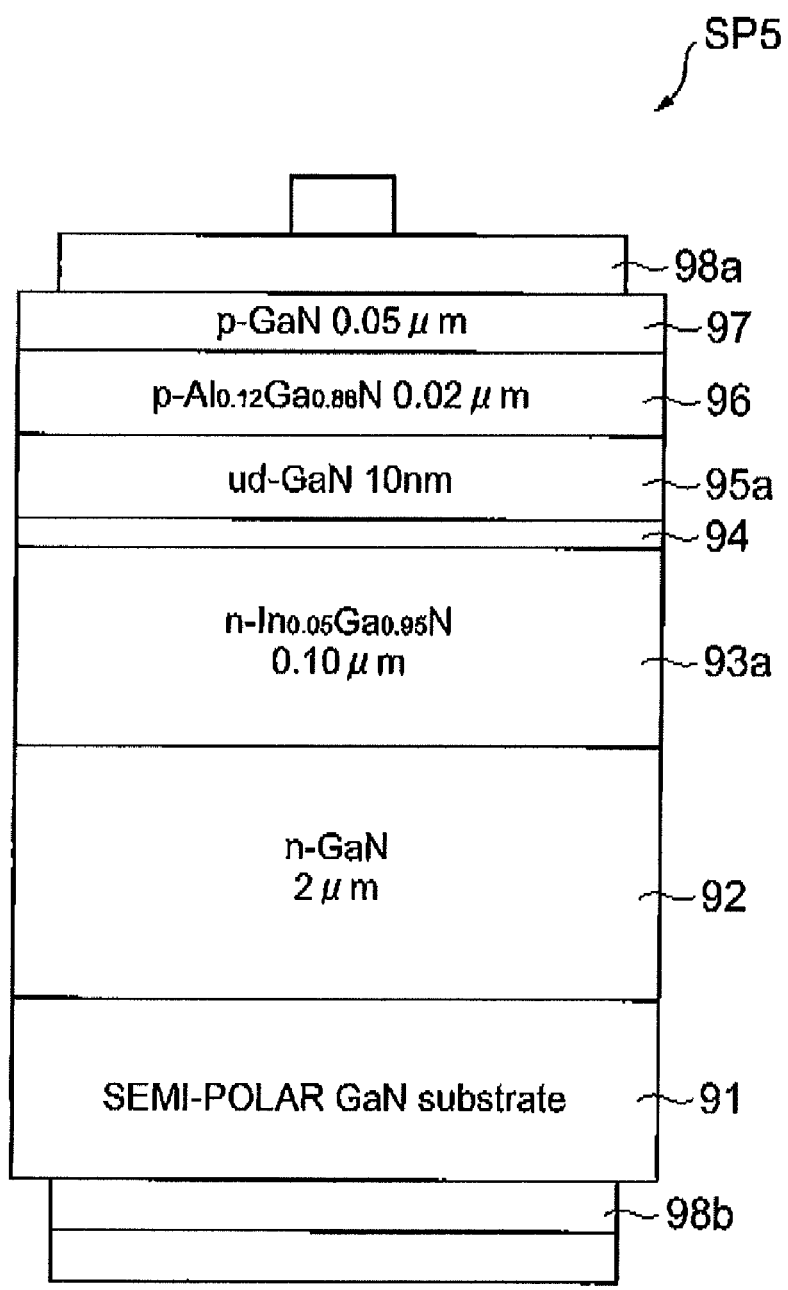
FIG. 9 is a drawing illustrating the structure of a laser diode in Example 5.

A laser diode shown in FIG. 9 is fabricated. A GaN substrate 91 is prepared, and has a semi-polar surface tilting from the c-plane toward the m-axis at an angle of 75 degrees. This plane orientation is equivalent to the plane {20-21}. A GaN substrate 91 is placed in a growth reactor. The substrate 91 is heat-treated at a temperature of 1050 degrees Celsius under a pressure of 27 kPa for 10 minutes while supplying NH$_3$ and H$_2$ stream to the reactor. After the heat treatment, an n-type GaN layer 92 having a thickness of 2 μm is grown on a semi-polar GaN surface at a temperature of 1050 degrees Celsius. After the substrate temperature is changed to 750 degrees Celsius, an n-type InGaN buffer layer 93a having a thickness of 0.10 μm is grown on the n-type GaN layer 92.

An active layer 94 is grown on the buffer layer 93a. This active layer has a single quantum well layer. The InGaN well layer has a growth temperature in the range of 690 to 720 degrees Celsius and an indium content of 0.35 to 0.65. The well layer has a thickness of 2.2 nm. After the substrate temperature is changed to 880 degrees Celsius, an undoped GaN barrier layer 95a is grown thereon.

Subsequently, a p-type AlGaN electron blocking layer 96 is grown at a temperature of 880 degrees Celsius on the GaN layer 95a. This electron blocking layer 96 has an aluminum content of 0.12. The substrate temperature remains unchanged, and a p-type GaN contact layer 97 having a thickness of 0.05 μm is grown thereon. The entire semiconductor layers are grown thereon under a pressure of 100 kPa. Through these steps, an epitaxial substrate is fabricated.

An electrode is formed on the epitaxial substrate having an LED structure. An anode (e.g. Ni/Au) 98a is formed by vacuum evaporation on the epitaxial substrate, and a cathode (e.g. Ti/Al) 98b is formed by vacuum evaporation on a back surface of the substrate. Pad electrodes (e.g. Ti/Au) are further formed by vapor phase deposition on these electrodes. Through these steps, a substrate product SP5 is fabricated.

This light-emitting diode is pulse-driven at room temperature (a current of 20 mA, a pulse width of 0.5 microseconds, and a duty of 2%), and emission is observed in the above indium content range, and has a wavelength in the range of 580 nm to 800 nm.

Example 6

Figure 10:
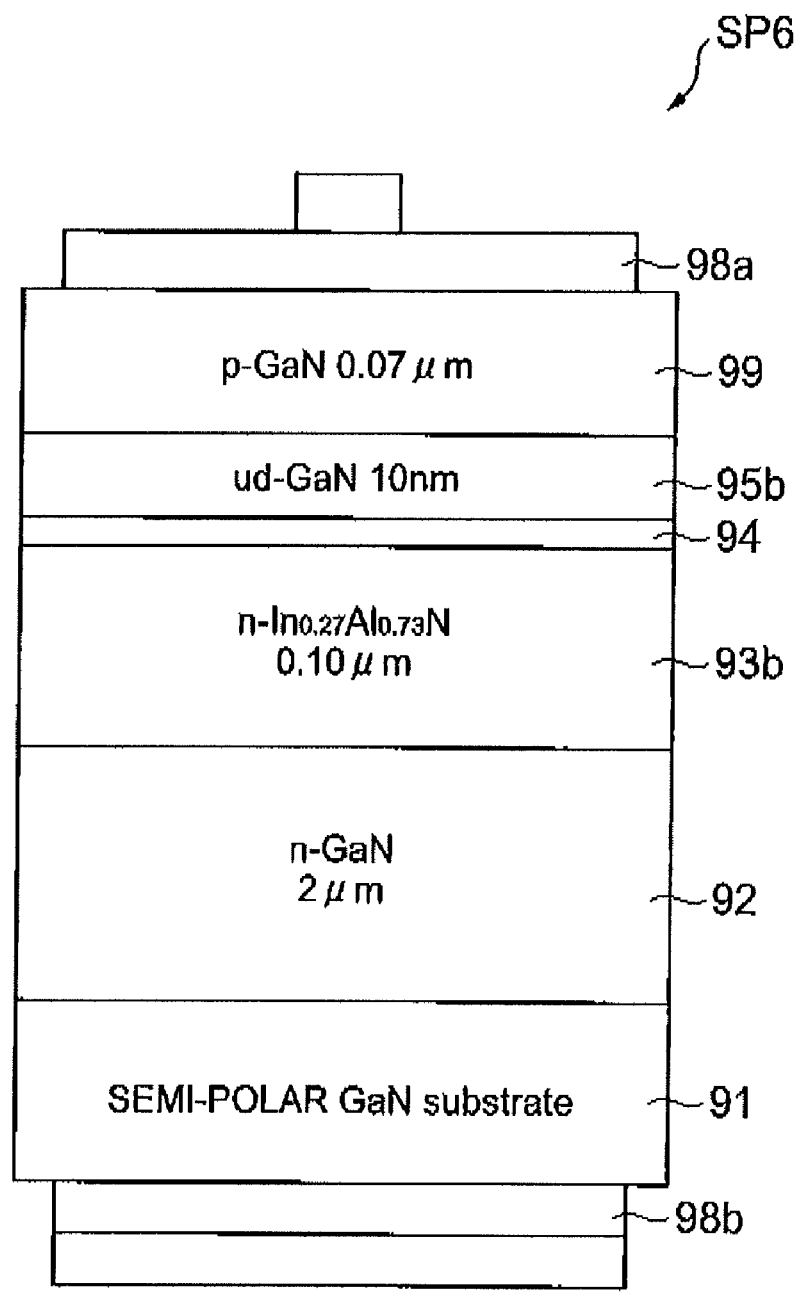
FIG. 10 is a drawing illustrating the structure of a laser diode in Example 6.

A light-emitting diode shown in FIG. 10 is fabricated. A GaN substrate 91 is prepared, and has a semi-polar surface tilting from the c-plane toward the m-axis at an angle of 75 degrees. This plane orientation is represented as {20-21} plane. First, a GaN substrate 91 is placed in a growth reactor. The substrate 91 is heat-treated at a temperature of 1050 degrees Celsius under a pressure of 27 kPa for 10 minutes while supplying NH$_3$ and H$_2$ to the reactor. After the heat treatment, an n-type GaN layer 92 having a thickness of 2 μm is grown on a semi-polar GaN surface at a temperature of 1050 degrees Celsius. After the substrate temperature is changed to 750 degrees Celsius, an n-type InAlN buffer layer 93b having a thickness of 0.10 μm is grown on the n-type GaN layer 92.

An active layer 94 is grown on the buffer layer 93b. This active layer 94 has a single quantum well layer. The InGaN well layer has a growth temperature in the range of 690 to 720 degrees Celsius and an indium content of 0.35 to 0.65. The well layer has a thickness of 2.2 nm.

After the substrate temperature is change to 880 degrees Celsius, an undoped GaN electron blocking layer 95b is grown. The substrate temperature remains unchanged, and a p-type GaN contact layer 99 having a thickness of 0.05 μm is grown. The InAlN layer is grown under a pressure of 40 kPa, and the entire other semiconductor layers are grown under a pressure of 100 kPa. Through these steps, an epitaxial substrate is fabricated.

An electrode is formed on the epitaxial substrate having an LED structure. An anode (e.g. Ni/Au) 98a is formed by vacuum evaporation on the epitaxial substrate, while a cathode (e.g. Ti/Al) 98b formed by vacuum evaporation on a back surface of the substrate. Pad electrodes (e.g. Ti/Au) are further formed by vacuum evaporation on these electrodes. Through these steps, a substrate product is fabricated.

This light-emitting diode is pulse-driven at room temperature (a current of 20 mA, a pulse width of 0.5 microseconds, and a duty of 2%), and lasing is observed in the above indium content range, and has a wavelength in the range of 580 nm to 800 nm.

In an active layer providing emission of a wavelength in the range longer than orange, since the well layer is made deep in depth, overflow of electrons is reduced. In the plane orientation such as the plane {20-21} having the direction of the piezoelectric field opposite to the plane (0001), the direction of the piezoelectric field in the well layer is oriented such that the height of the barrier of the p-type semiconductor region to the well layer increases. Consequently, instead of conventional AlGaN, GaN having a lower barrier can be used for an electron blocking layer.

The n-type InGaN layer used as a buffer layer in an n-type semiconductor region has a function to relax strain incorporated in a well layer. Although a higher indium content or a greater thickness of this layer results in higher relaxation of strain, strain in the InGaN layer is increased and causes creation of defects in the InGaN layer to make the crystallinity poor. Accordingly, the indium content and the thickness of the InGaN layer are limited thereto. In order to overcome this limitation, an InAlN buffer layer can be used. Using the InAlN buffer layer can reduce a degree of lattice mismatch and enhance relaxation of the strain.

As described above, the embodiment according to the present invention provides the III-nitride semiconductor optical device including the well layer with higher indium content and lower indium segregation. Further, the embodiment according to the present invention provides an epitaxial substrate for the III-nitride semiconductor optical device. Furthermore, the embodiment according to the present invention provides the method of fabricating the III-nitride semiconductor optical device.

The nitride semiconductor device emits red light, and as a result, emission of all of RGB colors can be provided by nitride semiconductor devices. For example, a single nitride semiconductor laser can emit three wavelengths for DVDs (650 nm), green (e.g. 520 nm), and blue (e.g. 440 nm), thereby improving temperature characteristics and so on. Furthermore, there is no need for assembly of three light-emitting devices and alignment of three beams. Since the active layer 17 generates light having a wavelength in the range of not longer than 800 nm, emission for CDs (780 nm) may be provided. In this case, a single nitride semiconductor laser can emit light of four wavelengths.

In recent years, long-wavelength emission of a group III nitride light-emitting device has been demanded. Thus, a semi-polar surface inclined with respect to the c-plane and a non-polar surface such as m- and a-planes are attracting attention for the following reasons. In order to produce long-wavelength emission, a well layer has a high indium content, so that difference in lattice constant between the well layer, and a barrier layer is increased to incorporate large strain in the emission layer. In this case, the quantum efficiency of the light-emitting device is made poor in a polar surface such as the c-plane due to an effect of the piezoelectric field. Various crystal planes encompassing non-polar surfaces such as the a-plane and m-plane have been investigated in order to avoid this effect. The efficiency higher than that of the c-plane, however, has not been achieved yet under the present circumstances. The inventors focus attention on a plane inclined from the c-plane toward the m-axis at an angle in the range of 63 degrees to less than 80 degrees so that the primary surface of the substrate forms a micro step structure composed of the m-plane and the plane {10-11} that tilts from the c-plane toward the m-axis at about 62 degrees. Specifically, the inventors focus attention on the {20-21} plane tilting from the c-plane toward the m-axis at an angle of 75 degrees, and a plane having a tilt angle in the range of 70 degrees to smaller than 80 degrees with respect to the c-plane toward the m-axis. In the region, the terrace width of the plane {10-11} is small and the terrace width of the m-plane is small, and the step density of the primary surface is increased, thereby reducing indium segregation.

As described above, the embodiment provides the III-nitride semiconductor optical device including the well layer with higher indium content and lower indium segregation. Further, the embodiment provides an epitaxial substrate for the III-nitride semiconductor optical device. Furthermore, the embodiment provides the method of fabricating the III-nitride semiconductor optical device.

Having illustrated and described the principle of the present invention in the preferred embodiments, but it is recognized by those skilled in the art that the present invention can be modified in arrangement and detail without departing from the principle. The present invention is by no means limited to the specific configurations disclosed in the embodiments. Therefore, we claim all modifications and changes falling within the scope of claims and resulting from the scope of spirit thereof.

The invention claimed is:

1. A group III nitride semiconductor optical device comprising:
   a substrate comprising a group III nitride semiconductor;
   a first group-III nitride semiconductor region provided on a primary surface of the substrate;
   a second group-III nitride semiconductor region provided on the primary surface of the substrate; and
   an active layer provided between the first group-III nitride semiconductor region and the second group-III nitride semiconductor region;
   the primary surface of the substrate tilting with respect to a plane perpendicular to a reference axis at a tilt angle in a range of not less than 63 degrees and less than 80 degrees, the reference axis extending along the c-axis of the group III nitride semiconductor toward an m-axis of the group III nitride semiconductor;
   the first group-III nitride semiconductor region including a first conductive type semiconductor layer;
   the second group-III nitride semiconductor region including a second conductive type semiconductor layer;
   the first group-III nitride semiconductor region, the active layer, and the second group-III nitride semiconductor region being arranged in a direction of an axis normal to the primary surface of the substrate;
   the active layer being provided to generate light having a wavelength in a range of 580 nm to 800 nm;
   the active layer including an epitaxial semiconductor layer,
   the epitaxial semiconductor layer comprising a gallium nitride based semiconductor, the gallium nitride based semiconductor containing indium as a group III element;
   the epitaxial semiconductor layer having an indium content ranging from 0.35 to 0.65;
   the c-axis of the gallium nitride based semiconductor tilting with respect to the normal axis; and
   the reference axis being oriented in a direction of one of [0001] axis and [000-1] axis of the group III nitride semiconductor.

2. The group III nitride semiconductor optical device according to claim 1, wherein the primary surface of the substrate is tilted with respect to the reference axis toward the m-axis of the group III nitride semiconductor at an angle of not less than 70 degrees.

3. The group III nitride semiconductor optical device according to claim 1, wherein the primary surface of the substrate is tilted with respect to the reference axis toward the m-axis of the group III nitride semiconductor at an angle in a range of not less than 71 degrees and not more than 79 degrees.

4. The group III nitride semiconductor optical device according to claim 1, wherein an off angle toward an a-axis of the group III nitride semiconductor is not zero and is in a range of −3 degrees to +3 degrees.

5. The group III nitride semiconductor optical device according to claim 1, wherein the primary surface of the substrate is a semiconductor surface tilting toward the m-axis with respect to one of plane {20-21} and {20-2-1} of the group III nitride semiconductor at an angle ranging from −3 degrees to +3 degrees.

6. The group III nitride semiconductor optical device according to claim 1, wherein the active layer has a single quantum well structure.

7. The group III nitride semiconductor optical device according to claim 1, wherein the active layer is provided to generate light having a wavelength in a range of longer than 650 nm to 800 nm.

8. The group III nitride semiconductor optical device according to claim 1, comprising:
   a first optical guide layer provided between the active layer and the first group-III nitride semiconductor region; and
   a second optical guide layer provided between the active layer and the second group-III nitride semiconductor region,
   a total thickness of the first and second optical guide layers being not smaller than 0.7 micrometers.

9. The group III nitride semiconductor optical device according to claim 8, wherein the total thickness of the first and second optical guide layers is not smaller than 0.9 micrometers.

10. The group III nitride semiconductor optical device according to claim 8, wherein
    the first optical guide layer includes a first optical guide portion and a second optical guide portion;

the second optical guide portion has a larger refractive index than that of the first optical guide portion;

the first optical guide portion is provided between the second optical guide portion and the first group-III nitride semiconductor region;

the second optical guide portion is provided between the first optical guide portion and the active layer;

the second optical guide portion includes an InGaN layer; and the first optical guide portion includes at least one of an InGaN layer, an InAlGaN layer, an InAlN layer, and a GaN layer.

11. The group III nitride semiconductor optical device according to claim 8, wherein
the first optical guide layer includes a first optical guide portion and a second optical guide portion;
the second optical guide portion has a larger refractive index than that of the first optical guide portion;
the first optical guide portion is provided between the second optical guide portion and the first group-III nitride semiconductor region;
the second optical guide portion is provided between the first optical guide portion and the active layer;
the second optical guide portion includes an InAlN layer; and
the first optical guide portion includes at least one of an InGaN layer, an InAlGaN layer, an InAlN layer, and a GaN layer.

12. The group III nitride semiconductor optical device according to claim 8, wherein the first optical guide layer includes a first InGaN layer having an indium content of not lower than 0.07.

13. The group III nitride semiconductor optical device according to claim 8, wherein the first optical guide layer includes a first InAlN layer having a larger refractive index than that of GaN.

14. The group III nitride semiconductor optical device according to claim 13, wherein the first InAlN layer has a lattice constant lattice-matched to that of GaN.

15. The group III nitride semiconductor optical device according to claim 13, wherein the second optical guide layer includes a second InGaN layer having an indium content of not lower than 0.07.

16. The group III nitride semiconductor optical device according to claim 8, wherein the second optical guide layer includes a second InAlN layer having a larger refractive index than that of GaN.

17. The group III nitride semiconductor optical device according to claim 8, wherein
the substrate comprises GaN;
the first optical guide layer includes an $In_{X1}Al_{Y1}Ga_{1-X1-Y1}N$ ($0 \leq X1 \leq 1$, $0 \leq Y1 \leq 1$) layer and a GaN layer; and
the second optical guide layer includes an $In_{X2}Al_{Y2}Ga_{1-X2-Y2}N$ ($0 \leq X2 \leq 1$, $0 \leq Y2 \leq 1$) layer and a GaN layer.

18. The group III nitride semiconductor optical device according to claim 1, wherein the second conductive type is a p-type, and the first conductive type is an n-type,
the group III nitride semiconductor optical device further comprising an electron blocking layer provided between the active layer and the second group-III nitride semiconductor region, the electron blocking layer comprises the same material as that of the substrate.

19. An epitaxial substrate for a group III nitride semiconductor optical device, comprising:
a substrate comprising group III nitride semiconductor;
a first group-III nitride semiconductor region provided on a primary surface of the substrate;
a second group-III nitride semiconductor region provided on the primary surface of the substrate; and an active layer provided between the first group-III nitride semiconductor region and the second group-III nitride semiconductor region, the primary surface of the substrate tilting with respect to a plane perpendicular to a reference axis at a tilt angle in a range of not less than 63 degrees and less than 80 degrees, the reference axis extending along the c-axis of the group III nitride semiconductor toward the m-axis of the group III nitride semiconductor;

the first group-III nitride semiconductor region including a first conductive type semiconductor layer;

the second group-III nitride semiconductor region including a second conductive type semiconductor layer;

the first group-III nitride semiconductor region, the active layer, and the second group-III nitride semiconductor region being arranged in a direction of an axis normal to the primary surface of the substrate;

the active layer being provided to generate light having a wavelength in a range of 580 nm to 800 nm;

the active layer including an epitaxial semiconductor layer, the epitaxial semiconductor layer comprising a gallium nitride based semiconductor, the gallium nitride based semiconductor containing indium as a group III element;

the epitaxial semiconductor layer having an indium content ranging from 0.35 to 0.65;

the c-axis of the gallium nitride semiconductor tilting with respect to the normal axis; and the reference axis being oriented in a direction of one of [0001] axis and [000–1] axis of the group III nitride semiconductor.

20. A method of making a group III nitride semiconductor light-emitting device, the method comprising the steps of:
preparing a substrate, the substrate comprising a group III nitride semiconductor;
growing a first group-III nitride semiconductor region on a primary surface of the substrate;
growing an active layer on the primary surface of the substrate, the active layer generating light of a wavelength in a range of 580 nm to 800 nm; and
growing a second group-III nitride semiconductor region on the primary surface of the substrate,
the active layer being provided between the first group-III nitride semiconductor region and the second group-III nitride semiconductor region,
the primary surface of the substrate tilting at a tilt angle in a range of not less than 63 degrees and less than 80 degrees toward the m-axis of the group III nitride semiconductor with respect to a plane perpendicular to a reference axis, the reference axis extending along the c-axis of the group III nitride semiconductor,
the first group-III nitride semiconductor region including a first conductive type semiconductor layer,
the second group-III nitride semiconductor region including a second conductive type semiconductor layer,
the active layer including an epitaxial semiconductor layer,
the epitaxial semiconductor layer comprising a gallium nitride based semiconductor, the gallium nitride based semiconductor containing indium as a group III element,
the epitaxial semiconductor layer having an indium content ranging from 0.35 to 0.65,
a c-axis of the group III nitride semiconductor tilting with respect to the normal axis, and
a direction of the reference axis is the same as a direction of one of axis [0001] and [000–1] of the group III nitride semiconductor.

* * * * *